(12) United States Patent
Wu et al.

(10) Patent No.: US 12,363,870 B1
(45) Date of Patent: Jul. 15, 2025

(54) FAN BRACKET, HEAT DISSIPATION ASSEMBLY, AND SERVER CABINET

(71) Applicant: SUZHOU METABRAIN INTELLIGENT TECHNOLOGY CO., LTD., Jiangsu (CN)

(72) Inventors: Chun Hsien Wu, Jiangsu (CN); Chang Ming Kuan, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/868,713

(22) PCT Filed: Jun. 29, 2023

(86) PCT No.: PCT/CN2023/104023
§ 371 (c)(1),
(2) Date: Nov. 22, 2024

(87) PCT Pub. No.: WO2024/109052
PCT Pub. Date: May 30, 2024

(30) Foreign Application Priority Data

Nov. 24, 2022 (CN) .......................... 202211483038.X

(51) Int. Cl.
*H05K 7/20* (2006.01)
(52) U.S. Cl.
CPC ................. *H05K 7/20736* (2013.01)
(58) Field of Classification Search
CPC .................. H05K 7/20736; H05K 7/20172
See application file for complete search history.

(56) References Cited

U.S. PATENT DOCUMENTS

| | | | |
|---|---|---|---|
| 11,686,467 B1 * | 6/2023 | Yuan | F04D 25/166 362/96 |
| 2005/0280990 A1 | 12/2005 | Goodenough et al. | |
| 2008/0137293 A1 | 6/2008 | Yang | |
| 2013/0100613 A1 * | 4/2013 | Nakai | H05K 7/20563 415/213.1 |

FOREIGN PATENT DOCUMENTS

| CN | 108646897 A | 10/2018 |
|---|---|---|
| CN | 210864515 U | 6/2020 |

(Continued)

OTHER PUBLICATIONS

CN 211288259 U, English translation (Year: 2020).*

*Primary Examiner* — Mukundbhai G Patel
(74) *Attorney, Agent, or Firm* — IPro, PLLC

(57) ABSTRACT

A fan bracket, a heat dissipation assembly, and a server cabinet are provided. The fan bracket comprises: a first frame, a first rear cover, a second frame, and a second rear cover. The first frame is provided with a first accommodating cavity, the first accommodating cavity is used for accommodating a fan, the first frame and the first rear cover are detachably connected, and the first rear cover shields an opening of the first accommodating cavity. The second frame is provided with a second accommodating cavity, the second accommodating cavity is used for accommodating a fan, the second frame and the second rear cover are detachably connected, and the second rear cover shields an opening of the second accommodating cavity.

20 Claims, 11 Drawing Sheets

(56) References Cited

FOREIGN PATENT DOCUMENTS

| | | | | |
|---|---|---|---|---|
| CN | 211288259 | U | * | 8/2020 |
| CN | 112943659 | A | | 6/2021 |
| CN | 112943703 | A | | 6/2021 |
| CN | 216306291 | U | | 4/2022 |
| CN | 216381932 | U | | 4/2022 |
| CN | 115581027 | A | | 1/2023 |

* cited by examiner

FAN BRACKET, HEAT DISSIPATION ASSEMBLY, AND SERVER CABINET

CROSS REFERENCE TO RELATED APPLICATION

The present application claims the priority of the Chinese patent application 202211483038.X titled "FAN BRACKET, HEAT DISSIPATION ASSEMBLY, AND SERVER CABINET" filed in China National Intellectual Property Administration on Nov. 24, 2022, which is incorporated herein by reference in their entirety.

FIELD

The present application relates to the technical field of fan brackets, and in particular to a fan bracket, a heat dissipation assembly and a server cabinet.

BACKGROUND

With the development of science and technology, fan brackets are more and more widely used. Usually, a fan is installed in a fan bracket, and then the fan bracket is installed in a server cabinet, so that the fan may dissipate heat for the server in the server cabinet. However, in the conventional technology, the application range of the fan bracket is relatively narrow and cannot be adapted to different server cabinets.

SUMMARY

Embodiments of the present application provides a fan bracket to solve the problem that the application range of the fan bracket in the conventional technology is relatively narrow and the fan bracket cannot be adapted to different server cabinets.

In order to solve the above technical problem, the present application is implemented as follows.

The embodiments of the present application provides a fan bracket, the fan bracket comprising: a first frame, a first rear cover, a second frame and a second rear cover;
   the first frame has a first accommodating cavity for accommodating a fan, the first frame is detachably connected to the first rear cover, and the first rear cover blocks a cavity opening of the first accommodating cavity;
   the second frame has a second accommodating cavity for accommodating the fan, the second frame is detachably connected to the second rear cover, and the second rear cover blocks a cavity opening of the second accommodating cavity; and
   the first frame and the second frame are stacked and detachably connected, and the first rear cover is detachably connected to the second rear cover.

In some embodiments of the present application, the second frame is provided with a first hook, the first frame is provided with a first clamping slot, and the first hook is clamped into the first clamping slot.

In some embodiments of the present application, the first hook extends in a direction from the second frame to the first frame, and the first hook protrudes from the second frame.

In some embodiments of the present application, the second rear cover is provided with a second hook, the first rear cover is provided with a second clamping slot, and the second hook is clamped into the second clamping slot.

In some embodiments of the present application, a side of the first frame away from the first rear cover is provided with a connector bracket, and the first frame is detachably connected to the connector bracket;
   a side of the second frame away from the second rear cover is provided with the connector bracket, and the second frame is detachably connected to the connector bracket; and
   the connector bracket is configured to support a connector for being electrically connected to the fan.

In some embodiments of the present application, the side of the first frame away from the first rear cover is fixed with a plurality of first clamping bosses, and the side of the second frame away from the second rear cover is fixed with a plurality of second clamping bosses;
   the connector bracket comprises a supporting shell having a mounting surface, a plurality of first clamping plates are provided at intervals in a first direction on the mounting surface, the first clamping plate is provided with a first clamping hole, a plurality of second clamping plates are provided at intervals in a second direction on the mounting surface, the second clamping plate is provided with a second clamping hole, and an angle is between the first direction and the second direction;
   the first clamping boss is embedded in the first clamping hole or the second clamping hole on one of the connector brackets, and the second clamping boss is embedded in the first clamping hole or the second clamping hole on the other of the connector brackets; and
   the supporting shell has an accommodating space for accommodating and supporting the connector.

In some embodiments of the present application, the supporting shell comprises a first supporting plate, a second supporting plate, a first connecting plate, a second connecting plate and a third connecting plate;
   the first supporting plate and the second supporting plate are stacked with a gap therebetween, the gap forms the accommodating space, the first connecting plate, the second connecting plate and the third connecting plate are located between the first supporting plate and the second supporting plate, the first connecting plate is connected to the first supporting plate and the second supporting plate respectively, the second connecting plate is connected to the first supporting plate and the second supporting plate respectively, the third connecting plate is connected to the first supporting plate and the second supporting plate respectively, and the first connecting plate, the second connecting plate and the third connecting plate are connected in sequence;
   a plurality of first clamping plates are provided at intervals in a first direction on a surface of the first supporting plate away from the second supporting plate, and a plurality of second clamping plates are provided at intervals in a second direction on the surface of the first supporting plate away from the second supporting plate; and
   the second supporting plate is provided with a mounting slot for mounting the connector.

In some embodiments of the present application, a surface of the second supporting plate toward the first supporting plate is provided with a limiting hook, the limiting hook is located on both sides of the mounting slot, and the limiting hook is configured to abut against the connector and limit the connector when the connector is mounted in the mounting slot; and a surface of the first supporting plate toward the second supporting plate is provided with an abutting plate with a distance between the abutting plate and the second supporting plate, and the abutting plate is configured to abut against the connector when the connector is mounted in the mounting slot.

In some embodiments of the present application, an extension direction of the first connecting plate is the same as the first direction, an extension direction of the second connecting plate is the same as the second direction, the side of the first frame away from the first rear cover is provided with a first positioning hole, and the side of the second frame away from the second rear cover is provided with a second positioning hole;

the first supporting plate is provided with a first avoidance slot and a second avoidance slot, the first connecting plate is provided with a first positioning hook, the first positioning hook extends in a direction from the second supporting plate to the first supporting plate, the first positioning hook is penetrated in the first avoidance slot and protrudes from the first supporting plate, the second connecting plate is provided with a second positioning hook, the second positioning hook extends in a direction from the second supporting plate to the first supporting plate, the second positioning hook is penetrated in the second avoidance slot and protrudes from the first supporting plate; and the first positioning hole is clamped into the first positioning hook or the second positioning hook on one of the connector brackets, and the second positioning hole is clamped into the first positioning hook or the second positioning hook on the other of the connector brackets.

In some embodiments of the present application, the side of the first frame away from the first rear cover and the side of the second frame away from the second rear cover are mounted with a prompting member;

the prompting member located on the side of the first frame away from the first rear cover is configured to be connected to the fan in the first accommodating cavity and prompt when the fan in the first accommodating cavity fails; and the prompting member located on the side of the second frame away from the second rear cover is configured to be connected to the fan in the second accommodating cavity and prompt when the fan in the second accommodating cavity fails.

In some embodiments of the present application, the side of the first frame away from the first rear cover is provided with a prompting member bracket, the prompting member bracket is detachably connected to the first frame, and the prompting member is mounted on the prompting member bracket; and the side of the second frame away from the second rear cover is provided with the prompting member bracket, the prompting member bracket is detachably connected to the second frame, and the prompting member is mounted on the prompting member bracket.

In some embodiments of the present application, the prompting member comprises any one of a prompting light and a buzzer.

In some embodiments of the present application, the prompting member bracket comprises a mounting plate and a fixing plate;

the mounting plate has a first surface and a second surface opposite to each other, the fixing plate is connected to the first surface of the mounting plate, the mounting plate is provided with a mounting hole, the first surface of the mounting plate is provided with a supporting member, the supporting member is located around the mounting hole, the prompting member is penetrated in the mounting hole, the prompting member abuts against the supporting member, and the supporting member supports the prompting member;

the fixing plate is provided with a third clamping hole, the side of the first frame away from the first rear cover is provided with a first clamping platform, the side of the second frame away from the second rear cover is provided with a second clamping platform; and the first clamping platform is clamped into the third clamping hole on one of the prompting member brackets, and the second clamping platform is clamped into the third clamping hole on the other of the prompting member brackets.

In some embodiments of the present application, the side of the first frame away from the first rear cover is provided with a first clamping channel, the side of the second frame away from the second rear cover is provided with a second clamping channel, the fixing plate is provided with a limiting platform, and the limiting platform is spaced apart from the third clamping hole; and the limiting platform on one of the prompting member brackets is embedded in the first clamping channel, and the limiting platform on the other of the prompting member brackets is embedded in the second clamping channel.

In some embodiments of the present application, a cavity wall of the first accommodating cavity and a cavity wall of the second accommodating cavity are provided with a first positioning pin, the first rear cover and the second rear cover are provided with a second positioning pin, the first positioning pin is opposite to the second positioning pin, and the first positioning pin and the second positioning pin are configured to position the fan.

In some embodiments of the present application, the first rear cover is provided with a third hook, the third hook extends in a direction from the first rear cover to the first frame, the first frame is provided with a third clamping slot, and the third hook is embedded in the third clamping slot; and the second rear cover is provided with a fourth hook, the fourth hook extends in a direction from the second rear cover to the second frame, the second frame is provided with a fourth clamping slot, and the fourth hook is embedded in the fourth clamping slot.

In some embodiments of the present application, the first frame is provided with a handheld portion for carrying the first frame.

In some embodiments of the present application, the embodiments of the present application provide a heat dissipation assembly comprising a fan and the fan bracket according to any one of the above first aspects;

the first accommodating cavity and the second accommodating cavity are provided with the fan.

In some embodiments of the present application, the heat dissipation assembly further comprises a control circuit board and a connector; and the fan bracket comprises a connector bracket, the connector is mounted on the connector bracket, the connector is electrically connected to the fan, the connector is electrically connected to the control circuit board, and the control circuit board is configured to control the fan to operate.

In some embodiments of the present application, the fan bracket comprises a prompting member electrically connected to the connector, and the control circuit board is further configured to control the prompting member to prompt when the fan fails.

In some embodiments of the present application, the embodiments of the present application provide a server cabinet comprising a cabinet body and the heat dissipation assembly according to any one of the above second aspects;

the heat dissipation assembly is located in the cabinet body.

In the embodiment of the present application, since the first frame has the first accommodating cavity, the first frame is detachably connected to the first rear cover, and the first rear cover blocks the cavity opening of the first accommodating cavity, when it is necessary to mount the fan, the first rear cover may be separated from the first frame, then the fan is mounted in the first accommodating cavity, and then the first rear cover is connected to the first frame. Since the second frame has the second accommodating cavity, the second frame is detachably connected to the second rear cover, and the second rear cover blocks the cavity opening of the second accommodating cavity, when it is necessary to mount the fan, the second rear cover may be separated from the second frame, then the fan is mounted in the second accommodating cavity, and then the second rear cover is connected to the second frame. Since the first frame and the second frame are stacked and detachably connected, and the first rear cover and the second rear cover are detachably connected, the first frame and the second frame may be separated and the first rear cover and the second rear cover may be separated according to actual needs, so that the first frame and the second frame may be used separately. Or the first frame and the second frame may be connected, and the first rear cover and the second rear cover may be connected, so that the first frame and the second frame may be used at the same time. That is, in the embodiment of the present application, the first frame and the second frame are stacked and detachably connected, and the first rear cover and the second rear cover are detachably connected, so that in actual application the first frame and the second frame may be separated, the first rear cover and the second rear cover may be separated, or the first frame and the second frame may be connected, and the first rear cover and the second rear cover may be connected according to actual needs. That is, the fan is placed in the first frame, and the fan is placed in the second frame, so that the first frame and the second frame may be separated or connected according to actual needs, different frames may be provided for different server cabinets, different numbers of fans may dissipate heat for servers in the server cabinets, and the application of the fan bracket is wider in range and more flexible.

REFERENCE NUMBERS

Figure 1:
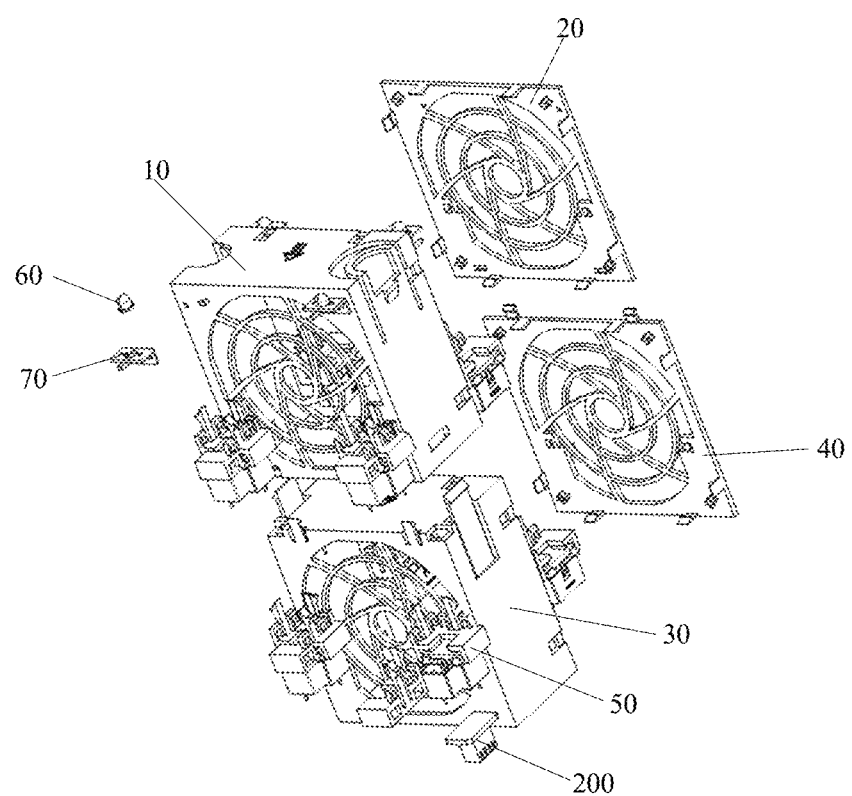
FIG. 1 is an exploded view of a fan bracket according to some embodiments of the present application.
Figure 2:
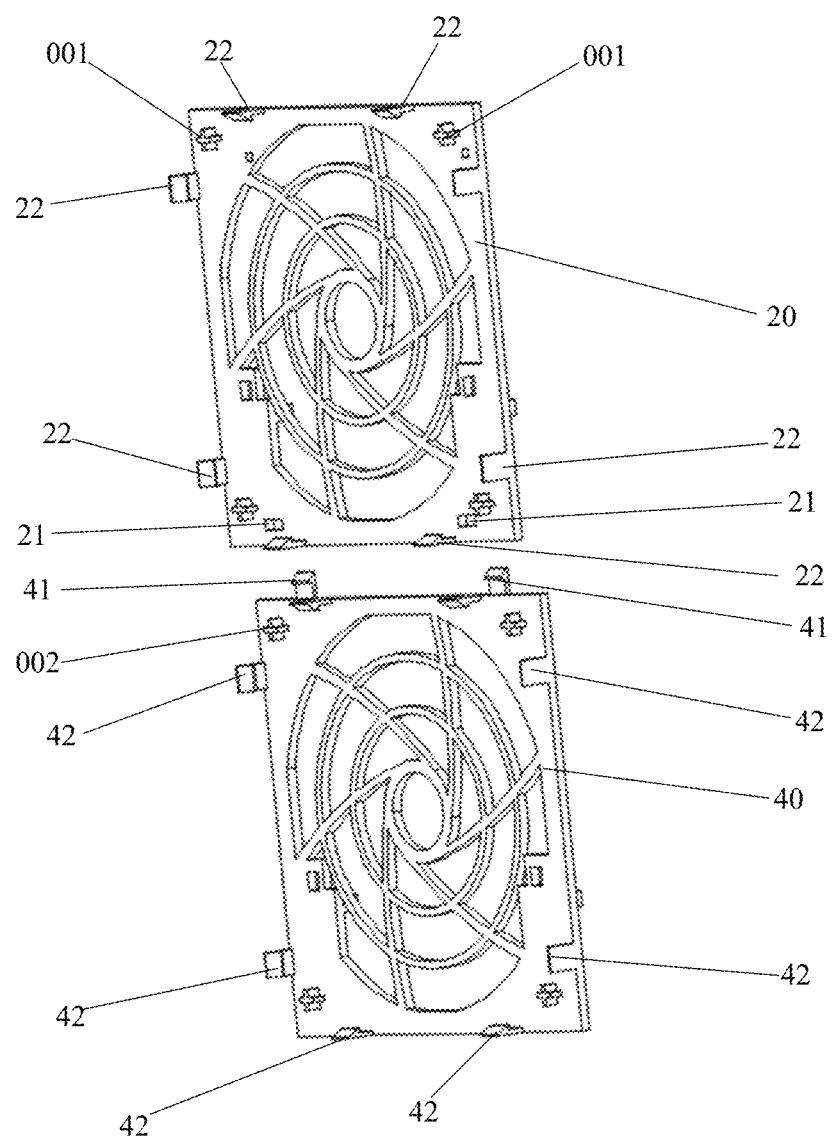
FIG. 2 is a schematic diagram of a first rear cover and a second rear cover according to some embodiments of the present application.
Figure 3:
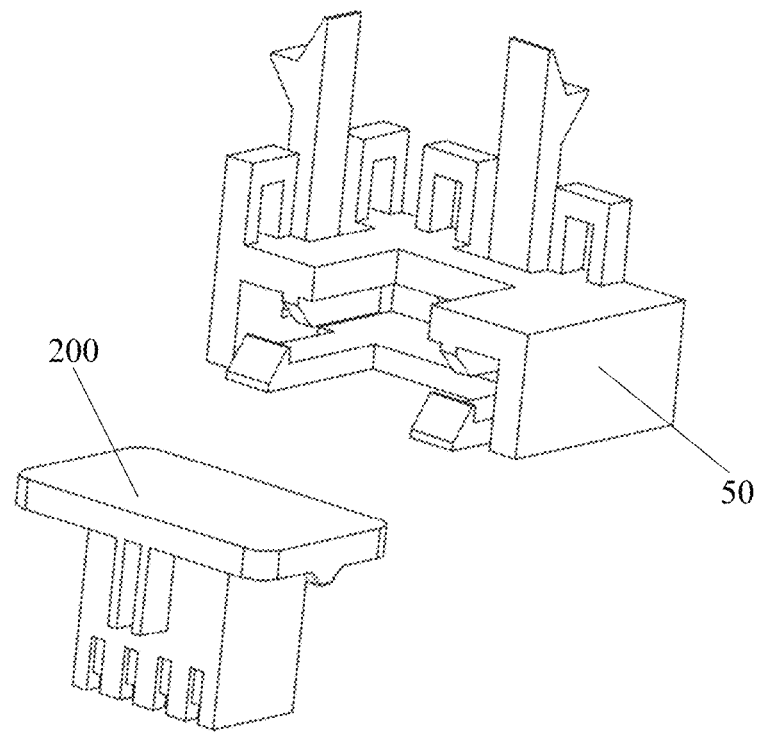
FIG. 3 is a schematic diagram of a connector and a connector bracket according to some embodiments of the present application.
Figure 4:
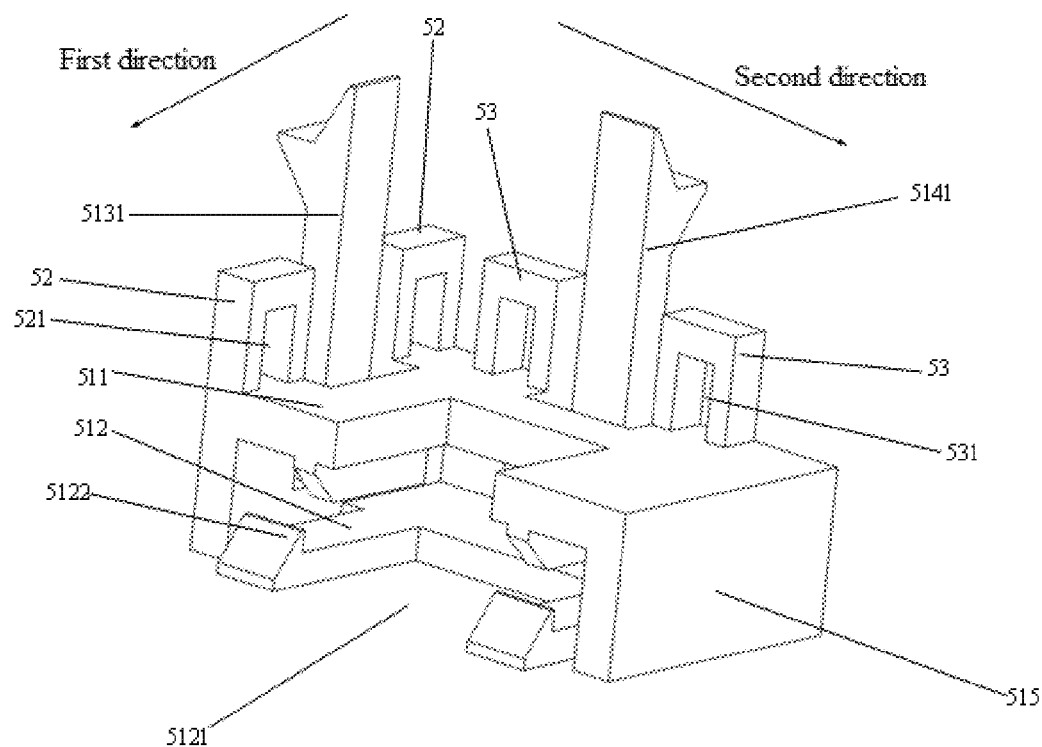
FIG. 4 is a schematic diagram of a connector bracket according to some embodiments of the present application.
Figure 5:
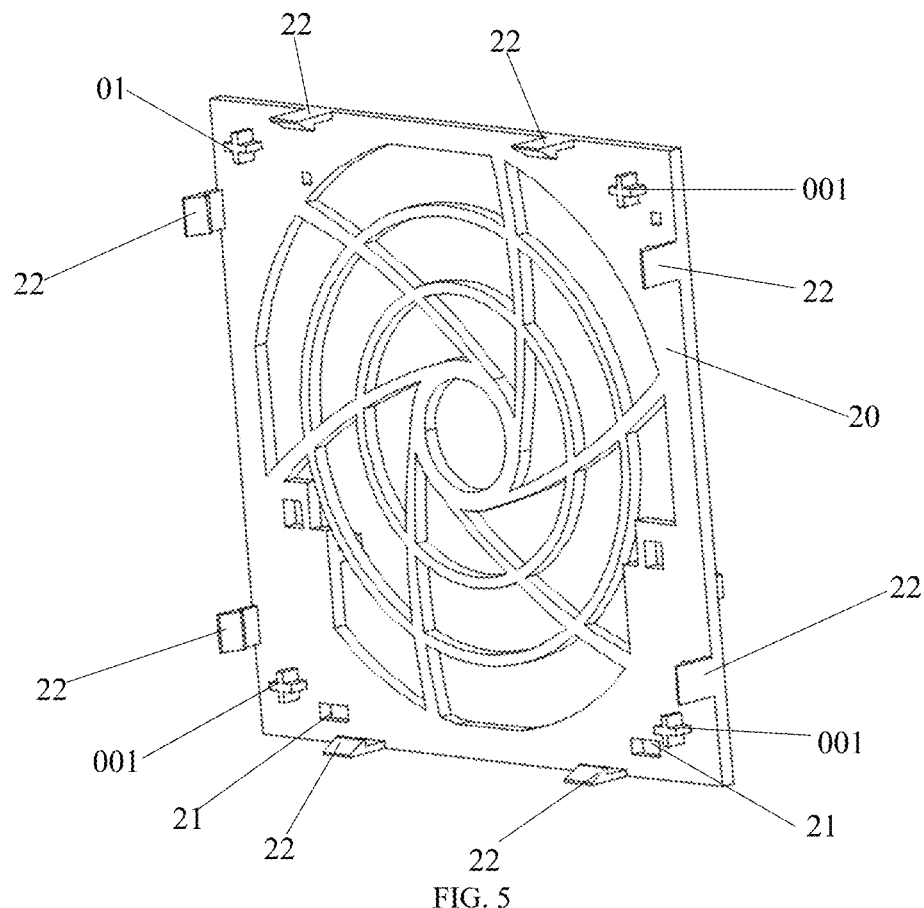
FIG. 5 is a schematic diagram of a first rear cover according to some embodiments of the present application.
Figure 6:
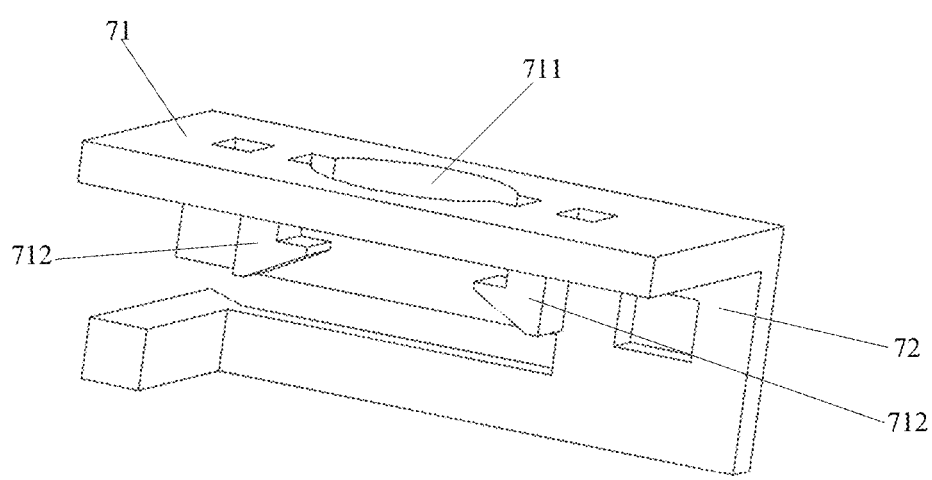
FIG. 6 is a schematic diagram of a reminder bracket according to some embodiments of the present application.
Figure 7:
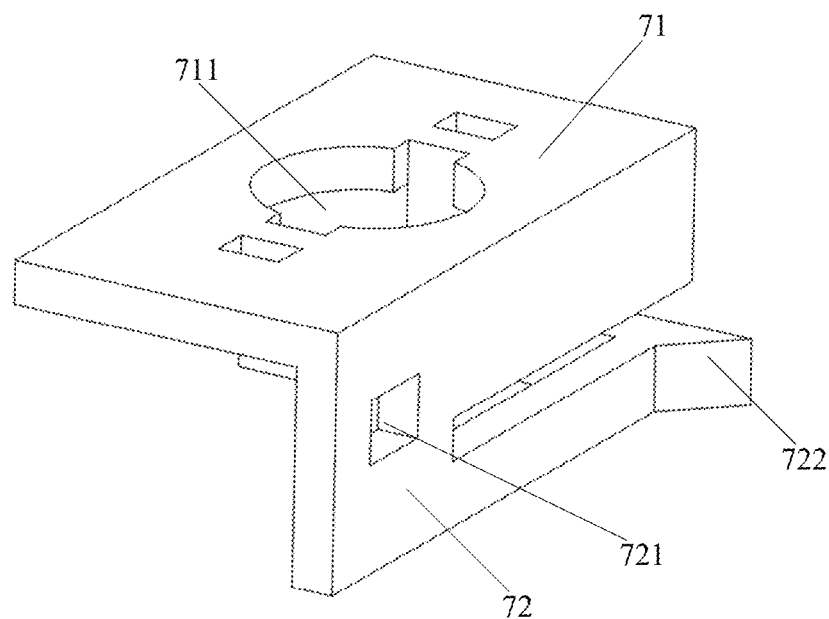
FIG. 7 is a schematic diagram of another reminder bracket according to some embodiments of the present application.
Figure 8:
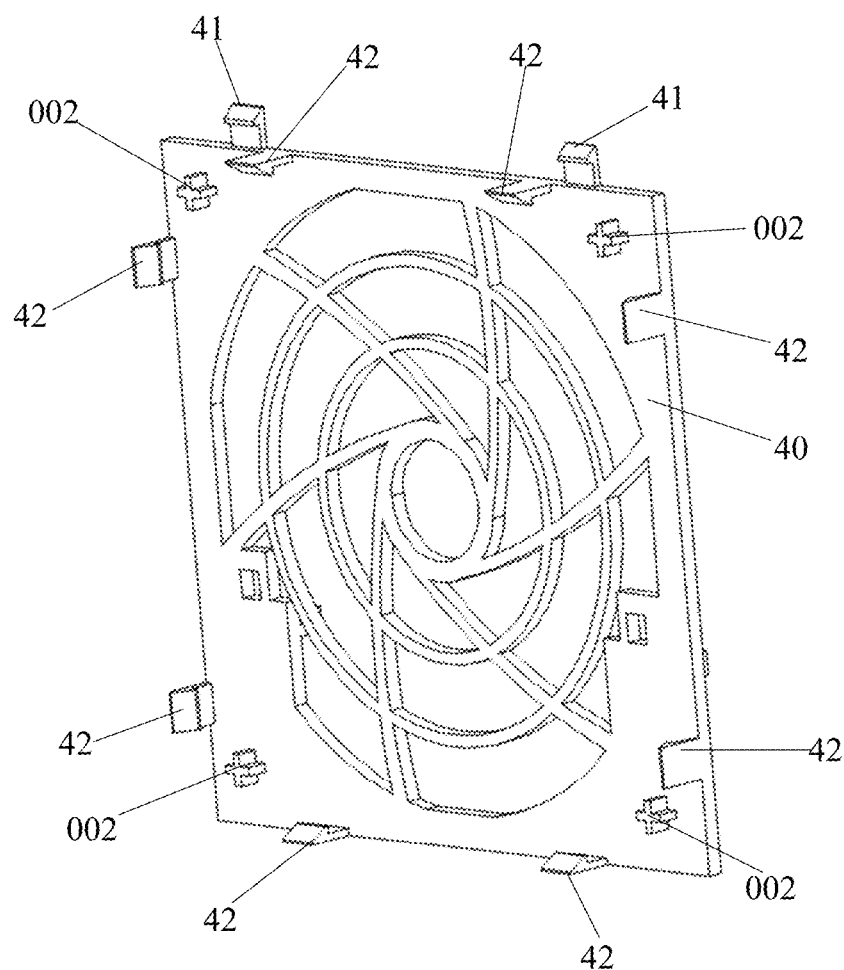
FIG. 8 is a schematic diagram of a second rear cover according to some embodiments of the present application.
Figure 9:
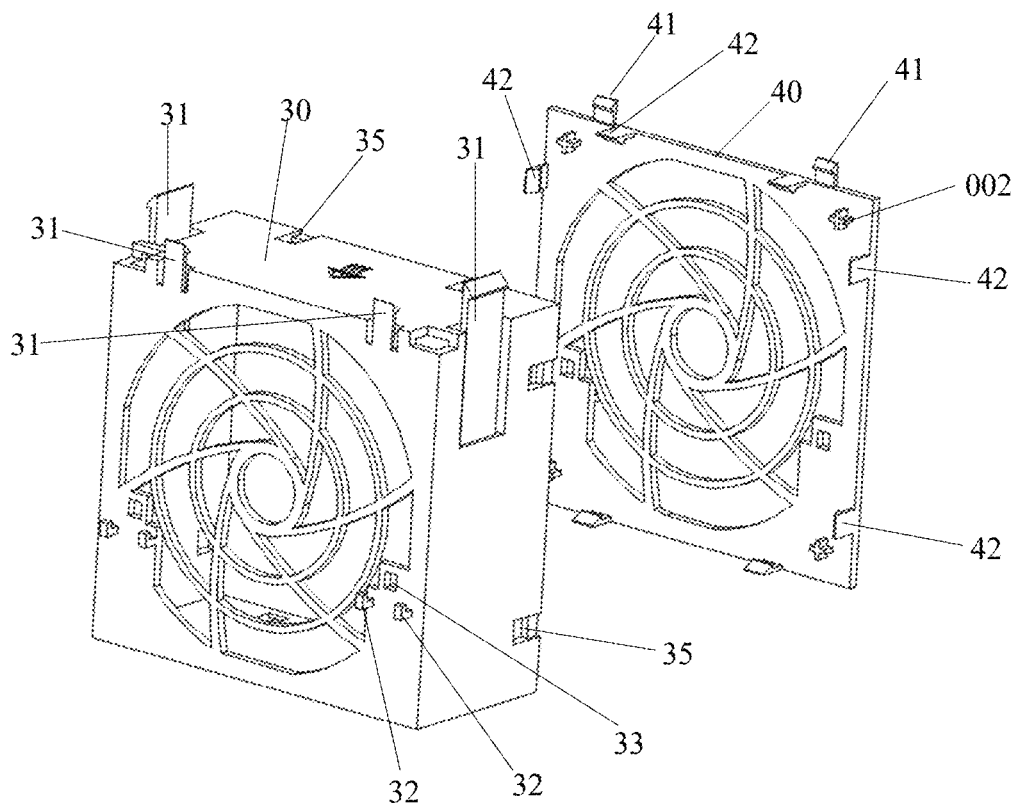
FIG. 9 is a schematic diagram of a second frame and a second rear cover according to some embodiments of the present application.
Figure 10:
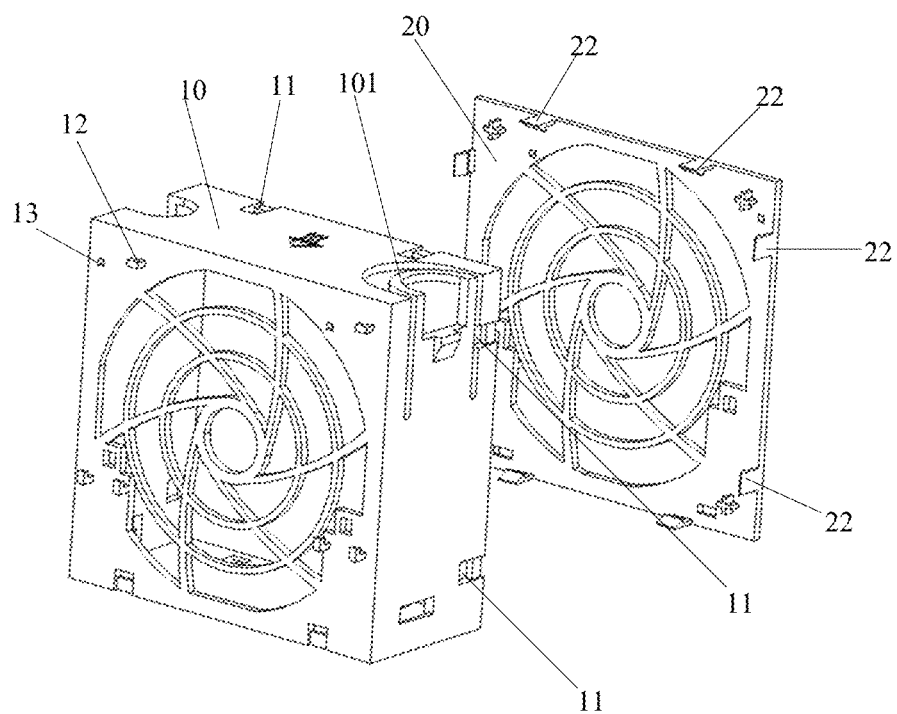
FIG. 10 is a schematic diagram of a first frame and a first rear cover according to some embodiments of the present application.
Figure 11:
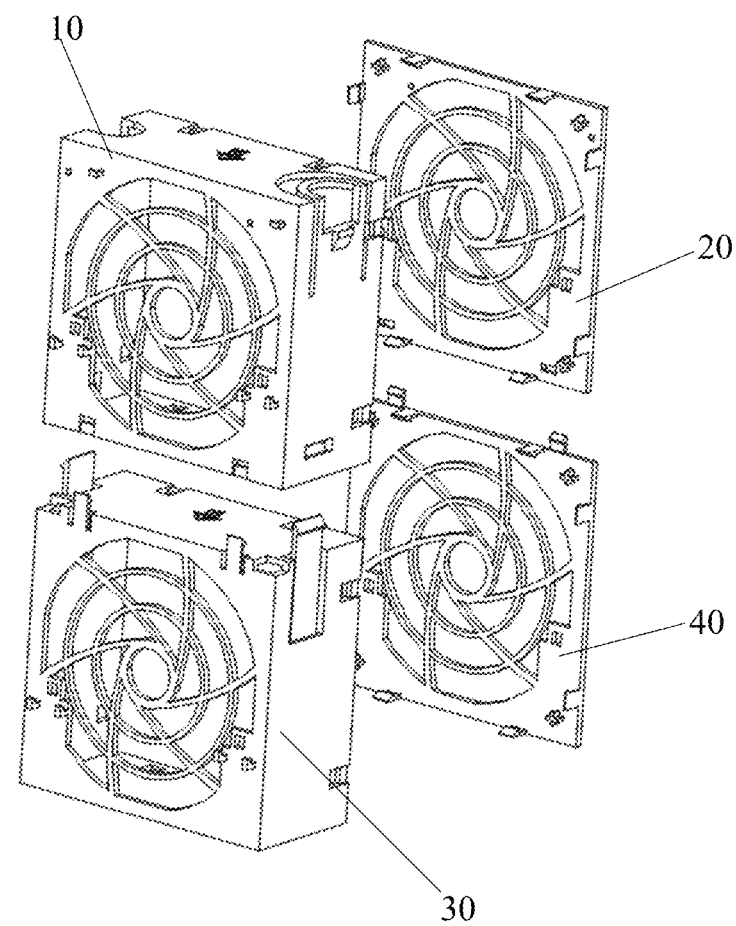
FIG. 11 is an exploded view of another fan bracket according to some embodiments of the present application.

001: first positioning pin; 002: second positioning pin; 10: first frame; 20: first rear cover; 30: second frame; 40: second rear cover; 50: connector bracket; 60: prompting member; 70: prompting member bracket; 11: first clamping slot; 12: first clamping boss; 13: first positioning hole; 14: first clamping platform; 15: first clamping channel; 21: second clamping slot; 22: third hook; 31: first hook; 32: second clamping boss; 33: second positioning hole; 34: second clamping platform; 35: second clamping channel; 41: second hook; 42: fourth hook; 51: supporting shell; 52: first clamping plate; 53: second clamping plate; 71: mounting plate; 72: fixing plate; 101: handheld portion; 301: second accommodating cavity; 511: first supporting plate; 512: second supporting plate; 513: first connecting plate; 514: second connecting plate; 515: third connecting plate; 521: first clamping hole; 531: second clamping hole; 711: mounting hole; 712: supporting member; 721: third clamping hole; 722: limiting platform; 5111: abutting plate; 5112: first avoidance slot; 5113: second avoidance slot; 5121: mounting slot; 5122: limiting hook; 5131: first positioning hook; 5141: second positioning hook; 100: fan; 200: connector; 300: cabinet body.

DETAILED DESCRIPTION OF THE EMBODIMENTS

The technical solutions of the embodiments of the present application may be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

It should be understood that references to "one embodiment" or "an embodiment" throughout the specification means that a particular feature, structure or characteristic relating to the embodiment is included in at least one embodiment of the present disclosure. Therefore, the words "in one embodiment" or "in an embodiment" appearing throughout the specification may not necessarily refer to the same embodiment. Furthermore, these specific characteristics, structures or properties may be combined in one or more embodiments in any suitable manner.

As shown in FIGS. 1 to 15, the fan bracket includes a first frame 10, a first rear cover 20, a second frame 30 and a second rear cover 40.

The first frame 10 has a first accommodating cavity for accommodating a fan 100. The first frame 10 is detachably connected to the first rear cover 20, and the first rear cover 20 blocks a cavity opening of the first accommodating cavity. The second frame 30 has a second accommodating cavity 301 for accommodating the fan 100. The second frame 30 is detachably connected to the second rear cover 40, and the second rear cover 40 blocks a cavity opening of the second accommodating cavity 301. The first frame 10 and the second frame 30 are stacked and detachably connected, and the first rear cover 20 and the second rear cover 40 are detachably connected.

In an embodiment of the present application, since the first frame 10 has the first accommodating cavity, the first frame 10 is detachably connected to the first rear cover 20, and the first rear cover 20 blocks the cavity opening of the first accommodating cavity, when it is necessary to mount the fan 100, the first rear cover 20 may be separated from the first frame 10, then the fan 100 is mounted in the first accommodating cavity, and then the first rear cover 20 is connected to the first frame 10. Since the second frame 30 has the second accommodating cavity 301, the second frame 30 is detachably connected to the second rear cover 40, and the second rear cover 40 blocks the cavity opening of the second accommodating cavity 301, when it is necessary to mount the fan 100, the second rear cover 40 may be separated from the second frame 30, then the fan 100 is mounted in the second accommodating cavity 301, and then the second rear cover 40 is connected to the second frame 30. Since the first frame 10 and the second frame 30 are stacked and detachably connected, and the first rear cover 20 and the second rear cover 40 are detachably connected, the first frame 10 and the second frame 30 may be separated and the first rear cover 20 and the second rear cover 40 may be separated according to actual needs, so that the first frame 10 and the second frame 30 may be used separately. Or the first frame 10 and the second frame 30 may be connected, and the first rear cover 20 and the second rear cover 40 may be connected, so that the first frame 10 and the second frame 30 may be used at the same time. That is, in the embodiment of the present application, the first frame 10 and the second frame 30 are stacked and detachably connected, and the first rear cover 20 and the second rear cover 40 are detachably connected, so that in actual application the first frame 10 and the second frame 30 may be separated, the first rear cover 20 and the second rear cover 40 may be separated, or the first frame 10 and the second frame 30 may be connected, and the first rear cover 20 and the second rear cover 40 may be connected according to actual needs. That is, the fan 100 is placed in the first frame 10, and the fan 100 is placed in the second frame 30, so that the first frame 10 and the second frame 30 may be separated or connected according to actual needs, different frames may be provided for different server cabinets, different numbers of fans 100 may dissipate heat for servers in the server cabinets, and the application of the fan bracket is wider in range and more flexible.

It should be noted that when the fan bracket in the embodiment of the present application is actually used, that is, when the fan bracket is applied to a server cabinet, multiple fan brackets may be provided in the server cabinet, and the multiple fan brackets may be provided in parallel. In addition, after the first frame 10 is connected to the second frame 30, the height of the fan bracket is higher, so that the fan bracket may be suitable for a 4U server cabinet. For a 2U or 3U server cabinet, the first frame 10 and the second frame 30 may be separated, and only the first frame 10 or the second frame 30 is used alone, that is, in a 2U or 3U server cabinet, only the first frame 10 is used, or only the second frame 30 is used.

In some embodiments of the present application, after the first frame 10 is connected to the second frame 30, the first rear cover 20 may be connected to the second rear cover 40, so that when the fan bracket is used as a complete whole, the strength of the fan bracket is higher and various components are tightly connected. That is, by making the first rear cover 20 and the second rear cover 40 are detachably connected, which may enhance the strength of the fan bracket.

In some embodiments of the present application, the number of the first frame 10 and the second frame 30 may be set according to actual needs, and the fan bracket has different forms. The following three forms are specifically described as examples.

Form (1): the fan bracket may further include a first frame 10 and a plurality of second frames 30, the first frame 10 is stacked with one second frame 30, which is stacked with the remaining second frames 30, the first frame 10 and the second frame 30 are detachably connected, and two adjacent second frames 30 are detachably connected.

Form (2): the fan bracket may further include a plurality of first frames 10 and a plurality of second frames 30, the plurality of first frames 10 are stacked, the plurality of second frames 30 are stacked, one first frame 10 after being stacked is stacked with one second frame 30 after being stacked, two adjacent first frames 10 are detachably connected, two adjacent second frames 30 are detachably connected, and the first frame 10 and the second frame 30 are detachably connected.

Form (3): the fan bracket may further include a plurality of first frames 10 and a second frame 30, the second frame 30 is stacked with one first frame 10, which is stacked with the remaining first frames 10, the first frame 10 and the second frame 30 are detachably connected, and two adjacent first frames 10 are detachably connected.

In some embodiments of the present application, the second frame 30 may be provided with a first hook 31, the first frame 10 may be provided with a first clamping slot 11, and the first hook 31 is clamped into the first clamping slot 11.

Since the second frame 30 is provided with the first hook 31 and the first frame 10 is provided with the first clamping slot 11, the first hook 31 may be clamped into the first clamping slot 11, so that the first frame 10 is connected to the second frame 30. When the first frame 10 and the second frame 30 need to be separated, the first hook 31 may be detached from the first clamping slot 11. Tat is, the second frame 30 is provided with the first hook 31, the first frame is provided with the first clamping slot 11, and the first hook 31 is clamped into the first clamping slot 11, so that the first frame 10 and the second frame 30 are detachably connected. In addition, the first hook 31 and the first clamping slot 11 are provided, so that the use of other tools may be avoided when the first frame 10 is connected to the second frame 30, and the operator may directly connect the first frame 10 and the second frame 30 by hand, that is, the effect of connecting the first frame 10 and the second frame 30 without tools is achieved.

It should be noted that the number of the first hooks 31 may be set according to actual needs. For example, the number of the first hooks 31 is two, and the two first hooks 31 are spaced apart. For another example, the number of the first hooks 31 is three, and the three first hooks 31 are spaced apart. The specific number of the first hooks 31 is not limited in the embodiments of the present application. In addition, the number of the first clamping slots 11 is equal to the number of the first hooks 31.

In some embodiments of the present application, the first frame 10 may be provided with the first hook 31, the second frame 30 may be provided with the first clamping slot 11, and the first hook 31 may be clamped into the first clamping slot 11, so that the first frame 10 and the second frame 30 are detachably connected.

Of course, the first frame 10 and the second frame 30 may be detachably connected in other ways, for example, the first frame 10 is provided with a through hole, the second frame 30 is provided with a threaded hole, and the first frame 10 and the second frame 30 are detachably connected by passing bolts through the through hole in the first frame 10 and the threaded hole in the second frame 30. The specific connection ways by which the first frame 10 and the second frame 30 are detachably connected is not limited in the embodiments of the present application.

In some embodiments of the present application, the first hook 31 extends in a direction from the second frame 30 to the first frame 10, and the first hook 31 protrudes from the second frame 30.

Since the first hook 31 extends in the direction from the second frame 30 to the first frame 10, and the first hook 31 protrudes from the second frame 30, when the first frame 10 needs to be connected to the second frame 30, the first hook 31 may be directly connected to the first clamping slot 11, thereby facilitating the detachable connection between the first frame 10 and the second frame 30.

In some embodiments of the present application, the second rear cover 40 may be provided with a second hook 41, the first rear cover 20 may be provided with a second clamping slot 21, and the second hook 41 is clamped into the second clamping slot 21.

Since the second rear cover 40 is provided with the second hook 41 and the first rear cover 20 is provided with the second clamping slot 21, the second hook 41 may be clamped into the second clamping slot 21, so that the first rear cover 20 is connected to the second rear cover 40. When the first rear cover 20 and the second rear cover 40 need to be separated, the second hook 41 may be detached from the second clamping slot 21. That is, the second rear cover 40 is provided with the second hook 41 and the first rear cover 20 is provided with the second clamping slot 21, the second hook 41 is clamped into the second clamping slot 21, so that the first rear cover 20 and the second rear cover 40 can be detachably connected. In addition, the second hook 41 and the second clamping slot 21 are provided, so that the use of other tools may be avoided when the first rear cover 20 is connected to the second rear cover 40, and the operator may directly connect the first rear cover 20 and the second rear cover 40 by hand, that is, the effect of connecting the first rear cover 20 and the second rear cover 40 without tools is achieved.

It should be noted that the number of the second hooks 41 may be set according to actual needs. For example, the number of the second hooks 41 is two, and the two second hooks 41 are spaced apart. For another example, the number of the second hooks 41 is three, and the three second hooks 41 are spaced apart. The specific number of the second hooks 41 is not limited in the embodiments of the present application. In addition, the number of the second clamping slots 21 is equal to the number of the second hooks 41.

In some embodiments of the present application, the first rear cover 20 may be provided with the second hook 41, the second rear cover 40 may be provided with the second clamping slot 21, and the second hook 41 may be clamped into the second clamping slot 21, so that the first rear cover 20 and the second rear cover 40 may be detachably connected.

Of course, the first rear cover 20 and the second rear cover 40 may be detachably connected in other ways, for example, the first rear cover 20 is provided with a through hole, the second rear cover 40 is provided with a threaded hole, so that the first rear cover 20 and the second rear cover 40 may detachably connected by passing bolts through the through hole in the first rear cover 20 and the threaded hole in the second rear cover 40. The specific connection ways by which the first frame 10 and the second frame 30 are detachably connected is not limited in the embodiments of the present application.

In some embodiments of the present application, the second hook 41 extends in the direction from the second rear cover 40 to the first rear cover 20, and the second hook 41 protrudes from the second rear cover 40.

Since the second hook 41 extends in the direction from the second rear cover 40 to the first rear cover 20, and the second hook 41 protrudes from the second rear cover 40, when the first rear cover 20 needs to be connected to the second rear cover 40, the second hook 41 may be directly connected to the second clamping slot 21, so as to facilitate the detachable connection between the first rear cover 20 and the second rear cover 40.

In some embodiments of the present application, a side of the first frame 10 away from the first rear cover 20 may be provided with a connector bracket 50, and the first frame 10 may be detachably connected to the connector bracket 50. A side of the second frame 30 away from the second rear cover 40 is provided with the connector bracket 50, and the second frame 30 may be detachably connected to the connector bracket 50. The connector bracket 50 is configured to support the connector 200, and the connector 200 is configured to be electrically connected to the fan 100.

Since the side of the first frame 10 away from the first rear cover 20 is provided with the connector bracket 50, and the first frame 10 is detachably connected to the connector bracket 50, after the fan 100 is mounted in the first frame 10, the connector 200 may also be mounted on the connector bracket 50, and the connector 200 may be electrically connected to the fan 100, so that after the connector 200 is connected to the control circuit board, the control circuit board may control the fan 100. In addition, the connector bracket 50 is detachably connected to the first frame 10, so that the connector bracket 50 may be mounted on the first frame 10 and the connector 200 may be mounted on the connector bracket 50 when necessary, and the connector bracket 50 may be separated from the first frame 10 when the connector bracket 50 needs to be replaced. In addition, the connector bracket 50 is detachably connected to the first frame 10, so that after the connector bracket 50 is separated from the first frame 10, the connector bracket 50 may be connected to other positions of the first frame 10, the position of the connector bracket 50 on the first frame 10 may be replaced, and when the fan bracket is used, the position of the connector bracket 50 may be adjusted according to actual needs, and then the position of the connector 200 may be adjusted, and the application of the fan bracket is more convenient.

Similarly, since the side of the second frame 30 away from the second rear cover 40 is provided with the connector bracket 50, and the second frame 30 and the connector bracket 50 are detachably connected, after the fan 100 is mounted on the second frame 30, the connector 200 may also be mounted on the connector bracket 50, and the connector 200 and the fan 100 are electrically connected, so that after the connector 200 is connected to the control circuit board, the control circuit board may control the fan 100. In addition, the connector bracket 50 and the second frame 30 are detachably connected, so that the connector bracket 50 may be mounted on the second frame 30 and the connector 200 may be mounted on the connector bracket 50 when necessary. When the connector bracket 50 needs to be replaced, the connector bracket 50 may be separated from the second frame 30. In addition, the connector bracket 50 is detachably connected to the second frame 30, so that after the connector bracket 50 is separated from the second frame 30, the connector bracket 50 may be connected to other positions of the second frame 30, the position of the connector bracket 50 on the second frame 30 may be replaced, when the fan bracket is used, the position of the connector bracket 50 may be adjusted according to actual needs, then the position of the connector 200 may be adjusted, and the application of the fan bracket is more convenient.

In some embodiments of the present application, the side of the first frame 10 away from the first rear cover 20 is fixed with a plurality of first clamping bosses 12, and the side of the second frame 30 away from the second rear cover 40 is fixed with a plurality of second clamping bosses 32. The connector bracket 50 includes a supporting shell 51, and the supporting shell 51 has a mounting surface, on which a plurality of first clamping plates 52 are provided at intervals along the first direction, the first clamping plate 52 is provided with a first clamping hole 521, a plurality of second clamping plates 53 are arranged at intervals along the second direction, the second clamping plate 53 is provided with a second clamping hole 531, and an angle is formed between the first direction and the second direction. The first clamping boss 12 is embedded in the first clamping hole 521 or the second clamping hole 531 on a connector bracket 50, and the second clamping boss 32 is embedded in the first clamping hole 521 or the second clamping hole 531 on the other connector bracket 50. The supporting shell 51 has an accommodating space for accommodating and supporting the connector 200.

Since the side of the first frame 10 away from the first rear cover 20 is fixed with a plurality of first clamping bosses 12, the plurality of first clamping plates 52 are provided at intervals in the first direction on the mounting surface of the supporting shell 51 of the connector bracket 50, the first clamping plate 52 is provided with a first clamping hole 521, a plurality of second clamping plates 53 are provided at intervals in the second direction, and the second clamping plate 53 is provided with a second clamping hole 531, the first clamping plates 52 may be clamped into the first clamping boss 12 through the first clamping hole 521, and the second clamping plate 53 may be clamped into the first clamping boss 12 through the second clamping hole 531. Since there is an angle between the first direction and the second direction, when the connector bracket 50 is clamped into the first frame 10, the connector bracket 50 may be clamped in different directions, so that the clamping direction of the connector bracket 50 may be selected according to actual needs, and the clamping of the connector bracket 50 to the first frame 10 is more in line with actual needs.

Similarly, since the side of the second frame 30 away from the second rear cover 40 is provided with a plurality of second clamping bosses 32, a plurality of first clamping plates 52 are provided at intervals in the first direction on the mounting surface of the supporting shell 51 of the connector bracket 50, the first clamping plate 52 is provided with a first clamping hole 521, and a plurality of second clamping plates 53 are provided at intervals in the second direction, and the second clamping plate 53 is provided with a second clamping hole 531, the first clamping plate 52 may be clamped into the second clamping boss 32 through the first clamping hole 521, and the second clamping plate 53 may be clamped into the second clamping boss 32 through the second clamping hole 531. Since there is an angle between the first direction and the second direction, when the connector bracket 50 is clamped into the second frame 30, the connector bracket 50 may be clamped in different directions, so that the clamping direction of the connector bracket 50 may be selected according to actual needs, and the clamping of the connector bracket 50 to the second frame 30 is more in line with actual needs.

In some embodiments of the present application, the supporting shell 51 has an accommodating space, and the connector 200 may be placed in the accommodating space, so that the supporting shell 51 accommodates the connector 200.

In actual use, the connector 200 may be first placed in the accommodating space of the supporting shell 51, then the connector bracket 50 may be clamped into the first frame 10, and then the connector bracket 50 may also be clamped into the second frame 30. Of course, the connector bracket 50 may also be clamped into the first frame 10 and the second frame 30 respectively, and then the connector 200 may be placed in the accommodating shell of the connector bracket 50.

It should be noted that the angle between the first direction and the second direction ranges from more than 0 degree to less than 180 degrees. That is, the angle between the first direction and the second direction is any value between 0 degree and 180 degrees. For example, the angle between the first direction and the second direction is 90 degrees. For another example, the angle between the first direction and the second direction is 100 degrees. For another example, the angle between the first direction and the second direction is 80 degrees. The specific value of the angle between the first direction and the second direction is not limited in the embodiments of the present application.

In some embodiments of the present application, the number of the first clamping plates 52 may be set according to actual needs, for example, the number of the first clamping plates 52 is 2, for example, the number of the first clamping plates 52 is 3, for example, the number of the first clamping plates 52 is 5. The number of the first clamping plates 52 is not limited in the embodiments of the present application. In addition, the number of the second clamping plates 53 may be set according to actual needs, for example, the number of the second clamping plates 53 is 2, for example, the number of the second clamping plates 53 is 3, for example, the number of the second clamping plates 53 is 4. The number of the second clamping plates 53 is not limited in the embodiments of the present application.

In some embodiments of the present application, the number of the first clamping bosses 12 may be equal to the number of the first clamping plates 52. Of course, the number of the first clamping bosses 12 may not be equal to the number of the first clamping plates 52, which is not limited in the embodiments of the present application. In addition, the number of the first clamping plates 52 may be equal to the number of the second clamping plates 53. Of course, the number of the first clamping plates 52 may not be equal to the number of the second clamping plates 53, which is not limited in the embodiments of the present application.

In some embodiments of the present application, the first clamping boss 12 may be bent shape, so that when the first clamping hole 521 is clamped into the first clamping boss 12, the first clamping boss 12 may first pass through the first clamping boss 12, and then move the first clamping hole 521 relative to the first clamping boss 12 along the bent shape of the first clamping boss 12, and the bent portion of the first clamping boss 12 blocks the first clamping hole 521, thereby preventing the first clamping plate 52 from falling off the first clamping boss 12. The shape of the second clamping boss 32 may be the same as that of the first clamping boss 12, so that the way in which the first clamping hole 521 is clamped into the second clamping boss 32 can refer to the way in which the first clamping hole 521 is clamped into the first clamping boss 12, which will not be described herein. In addition, the way in which the second clamping hole 531 is clamped into the first clamping boss 12 can refer to the way in which the first clamping hole 521 is clamped into the first clamping boss 12, which will not be described herein. The way in which the second clamping hole 531 is clamped into the second clamping boss 32 may refer to the way in which the first clamping hole 521 is clamped into the first clamping boss 12, which will not be described herein.

Figure 13:
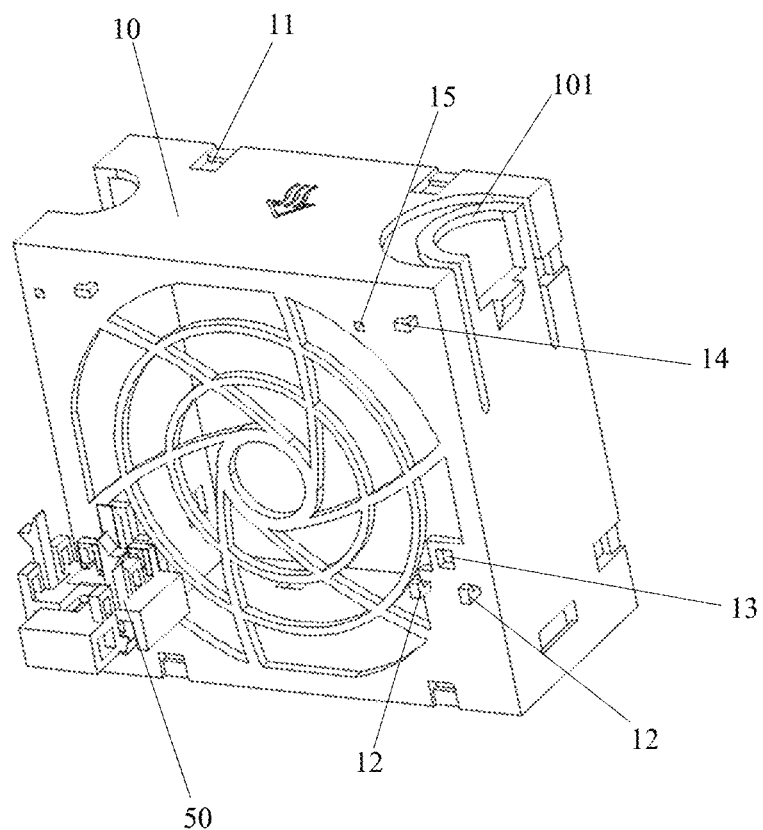
FIG. 13 is a schematic diagram of a first frame according to some embodiments of the present application.

For example, as shown in FIG. 13, when the first clamping plate 52 is clamped into the first clamping boss 12, the first clamping hole 521 may be first passed through the first clamping boss 12, and then the first clamping plate 52 may be moved, so that the bent portion of the first clamping boss 12 blocks the first clamping plate 52.

In some embodiments of the present application, the first clamping bosses 12 may be distributed at intervals on the first frame 10, that is, the first clamping bosses 12 may be located at different positions on the first frame 10, so that the position of the connector bracket 50 on the first frame 10 may be adjusted. Similarly, the second clamping bosses 32 may be spaced apart on the second frame 30, that is, the first clamping bosses 32 may be located at different positions on the first frame 30, so that the position of the connector bracket 50 on the second frame 30 may be adjusted.

Figure 12:
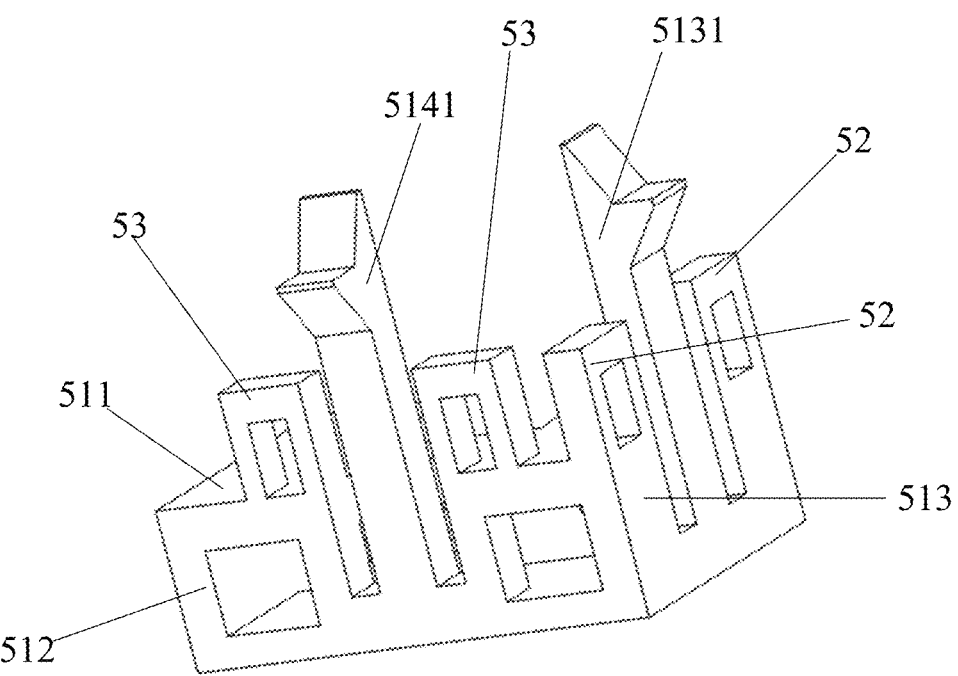
FIG. 12 is a schematic diagram of another connector bracket according to some embodiments of the present application.
Figure 14:
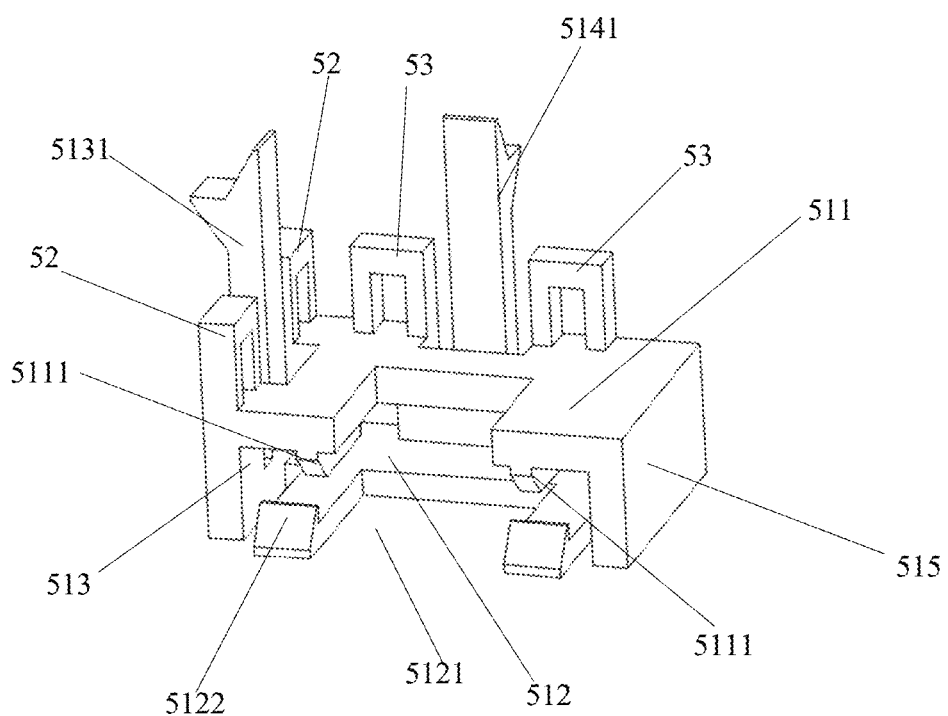
FIG. 14 is a schematic diagram of another connector bracket according to some embodiments of the present application.
Figure 15:
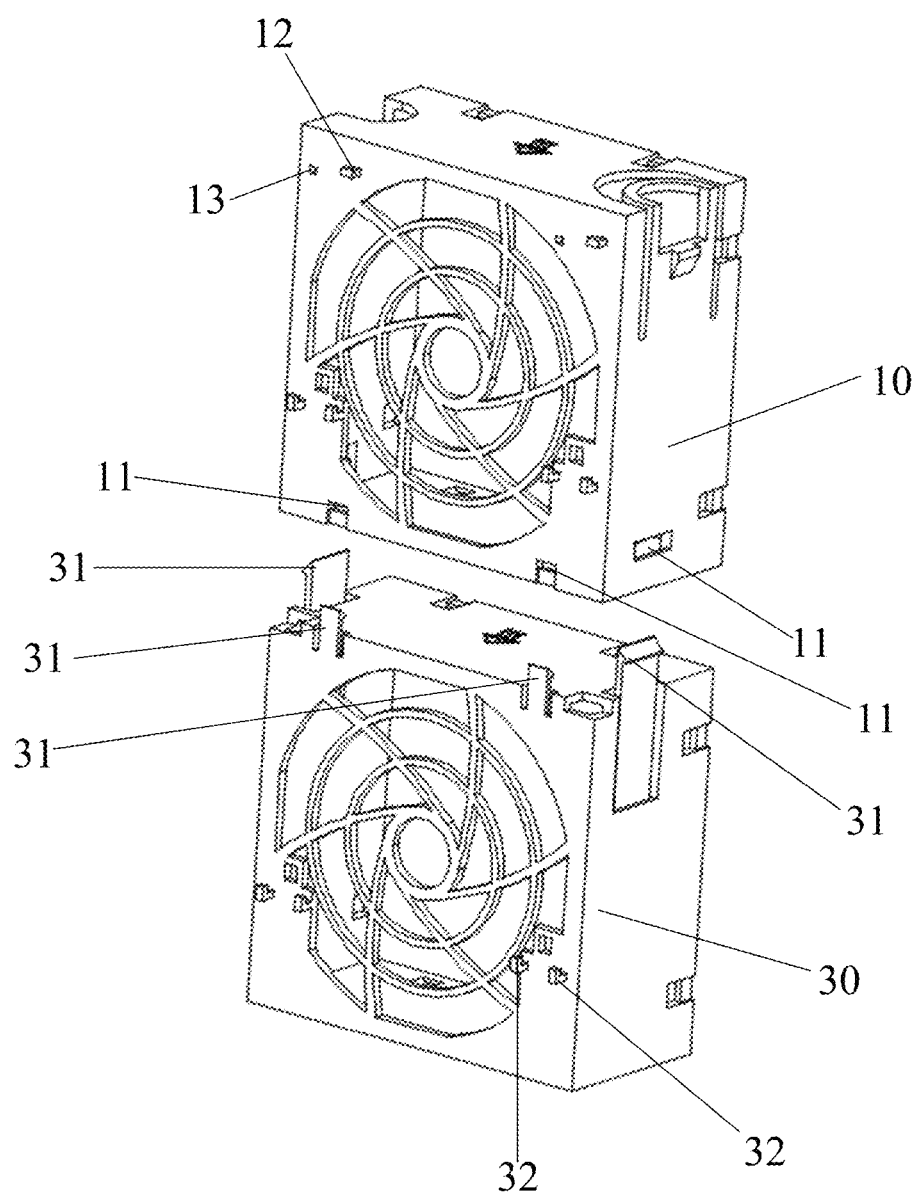
FIG. 15 is a schematic diagram of a first frame and a second frame according to some embodiments of the present application.

In some embodiments of the present application, as shown in FIG. 12 and FIG. 14, the supporting shell 51 may include a first supporting plate 511, a second supporting plate 512, a first connecting plate 513, a second connecting plate 514 and a third connecting plate 515. The first supporting plate 511 and the second supporting plate 512 are stacked with a gap between the first supporting plate 511 and the second supporting plate 512, and the gap forms an accommodating space. The first connecting plate 513, the second connecting plate 514 and the third connecting plate 515 are all located between the first supporting plate 511 and the second supporting plate 512. The first connecting plate 513 is connected to the first supporting plate 511 and the second supporting plate 512, respectively. The second connecting plate 514 is connected to the first supporting plate 511 and the second supporting plate 512, respectively. The third connecting plate 515 is connected to the first supporting plate 511 and the second supporting plate 512, respectively. The first connecting plate 513, the second connecting plate 514 and the third connecting plate 515 are connected in sequence. A plurality of first clamping plates 52 are provided at intervals in the first direction on the surface of the first supporting plate 511 away from the second supporting plate 512, and a plurality of second clamping plates 53 are provided at intervals in the second direction on the surface of the first supporting plate 511 away from the second supporting plate 512. The second supporting plate 512 is provided with a mounting slot 5121 for mounting the connector 200.

Since the first supporting plate 511 and the second supporting plate 512 are stacked with a gap, the gap may form an accommodating space for accommodating the connector 200. Since the first connecting plate 513, the second connecting plate 514 and the third connecting plate 515 are all located between the first supporting plate 511 and the second supporting plate 512, the first connecting plate 513 is connected to the first supporting plate 511 and the second supporting plate 512 respectively, the second connecting plate 514 is connected to the first supporting plate 511 and the second supporting plate 512 respectively, the third connecting plate 515 is connected to the first supporting plate 511 and the second supporting plate 512 respectively, and the first connecting plate 513, the second connecting plate 514 and the third connecting plate 515 are connected in sequence, the first connecting plate 513, the second connecting plate 514 and the third connecting plate 515 are equivalent to supporting the first supporting plate 511 and the second supporting plate 512. Since the second supporting plate 512 is provided with a mounting slot 5121, when the connector 200 is mounted, part of the connector 200 may be clamped into the mounting slot 5121, and part of the connector 200 is located in the gap between the first supporting plate 511 and the second supporting plate 512, so that the connector 200 is mounted on the supporting shell 51.

In some embodiments of the present application, the first connecting plate 513 may be provided with a weight-reducing hole, and the second connecting plate 514 may be provided with a weight-reducing hole, so as to reduce the weight of the supporting shell 51. The number of the weight-reducing holes may be set according to actual needs, for example, the number of the weight-reducing holes may be 2, and for another example, the number of the weight-reducing holes may be 1.

In some embodiments of the present application, a limiting hook 5122 may be provided on the surface of the second supporting plate 512 toward the first supporting plate 511, and the limiting hook 5122 is provided on both sides of the mounting slot 5121. The limiting hook 5122 is configured to abut against the connector 200 and limit the connector 200 when the connector 200 is mounted in the mounting slot 5121. An abutting plate 5111 is provided on the surface of the first supporting plate 511 toward the second support plate 512, and there is a distance between the abutting plate 5111 and the second supporting plate 512. The abutting plate 5111 is configured to abut against the connector 200 when the connector 200 is mounted in the mounting slot 5121.

Since the limiting hook 5122 is provided on the surface of the second supporting plate 512 toward the first supporting plate 511, and the limiting hook 5122 is located on both sides of the mounting slot 5121, after the connector 200 is mounted in the mounting slot 5121, the limiting hook 5122 may abut against the connector 200, thereby limiting the connector 200, preventing the connector 200 from detaching from the mounting slot 5121, and preventing the connector 200 from shaking in the mounting slot 5121. Since the abutting plate 5111 is provided on the surface of the first supporting plate 511 toward the second supporting plate 512, after the connector 200 is mounted in the mounting slot 5121, the abutting plate 5111 abuts against the connector 200, so that when the connector 200 is plugged into the control circuit board, the connector 200 will be subjected to a force in the direction from the second supporting plate 512 to the first supporting plate 511, but the abutting plate 5111 abuts against the connector 200, the abutting plate 5111 applies a force to the connector 200 to prevent the connector 200 from shaking due to the force in the direction from the second supporting plate 512 to the first supporting plate 511. That is, the limiting hook 5122 and the abutment plate 5111 are provided, after the connector 200 is mounted in the supporting shell 51, the connector 200 may be relatively stable, thereby preventing the connector 200 from shaking.

In some embodiments of the present application, the extension direction of the first connecting plate 513 is the same as the first direction, the extension direction of the second connecting plate 514 is the same as the second direction, the first frame 10 has a first positioning hole 13 on the side away from the first rear cover 20, and the second frame 30 has a second positioning hole 33 on the side away from the second rear cover 40. The first supporting plate 511 is provided with a first avoidance slot 5112 and a second avoidance slot 5113, the first connecting plate 513 is provided with a first positioning hook 5131, and the first positioning hook 5131 extends in the direction from the second supporting plate 512 to the first supporting plate 511, the first positioning hook 5131 is penetrated in the first avoidance slot 5112, and protrudes from the first supporting plate 511, the second connecting plate 514 is provided with a second positioning hook 5141, and the second positioning hook 5141 extends in the direction from the second supporting plate 512 to the first supporting plate 511, the second positioning hook 5141 is penetrated in the second avoidance slot 5113, and protrudes from the first supporting plate 511. The first positioning hole 13 is clamped into the first positioning hook 5131 or the second positioning hook 5141 on one connector bracket 50, and the second positioning hole 33 is clamped into the first positioning hook 5131 or the second positioning hook 5141 on another connector bracket 50.

Since the first frame 10 has a first positioning hole 13 on the side away from the first rear cover 20, the first support plate 511 is provided with the first avoidance slot 5112, the first connecting plate 513 is provided with the first positioning hook 5131, and the first positioning hook 5131 extends in the direction from the second supporting plate 512 to the first supporting plate 511, the first positioning hook 5131 may be penetrated in the first avoidance slot 5112 and protrude from the first supporting plate 511, so that when the first clamping hole 521 on the first clamping plate 52 is clamped into the first clamping boss 12, the first positioning hook 5131 is clamped into the first positioning hole 13, the first positioning hook 5131 is positioned by the first positioning hole 13, the first positioning hook 5131 is not easy to shake, and then the first connecting plate 513 is not easy to shake, and finally the connector bracket 50 is not easy to shake, that is, the connector bracket 50 is not easy to shake after being clamped into the first frame 10, and the connector bracket 50 may be relatively stable on the first frame 10. When the second clamping hole 531 on the second clamping plate 53 is clamped into the first clamping boss 12, the second positioning hook 5141 is clamped into the first positioning hole 13, so that the second positioning hook 5141 is positioned by the first positioning hole 13, the second positioning hook 5141 is not easy to shake, and then the second connecting plate 514 is not easy to shake, and finally the connector bracket 50 is not easy to shake, that is, the connector bracket 50 is not easy to shake after being clamped into the first frame 10, and the connector bracket 50 may be more stable on the first frame 10.

Similarly, since the second frame 30 has a second positioning hole 33 on the side away from the second rear cover 40, the first support plate 511 is provided with the first avoidance slot 5112, the first connecting plate 513 is provided with the first positioning hook 5131 is provided, and the first positioning hook 5131 extends in the direction from the second supporting plate 512 to the first supporting plate 511, the first positioning hook 5131 may be penetrated in the first avoidance slot 5112 and protrude from the first supporting plate 511, so that when the first clamping hole 521 on the first clamping plate 52 is clamped into the first clamping boss 12, the first positioning hook 5131 is clamped into the second positioning hole 33, the first positioning hook 5131 is positioned by the second positioning hole 33, the first positioning hook 5131 is not easy to shake, and then the first connecting plate 513 is not easy to shake, and finally the connector bracket 50 is not easy to shake, that is, the connector bracket 50 is not easy to shake after being clamped into the second frame 30, and the connector bracket 50 may be relatively stable on the second frame 30. When the second clamping hole 531 on the second clamping plate 53 is clamped into the first clamping boss 12, the second positioning hook 5141 is clamped into the first positioning hole 13, so that the second positioning hook 5141 is positioned by the first positioning hole 13, the second positioning hook 5141 is not easy to shake, and then the second connecting plate 514 is not easy to shake, and finally the connector bracket 50 is not easy to shake, that is, the connector bracket 50 is not easy to shake after being clamped into the second frame 30, and the connector bracket 50 may be more stable on the second frame 30.

In some embodiments of the present application, a prompting member 60 may be mounted on the side of the first frame 10 away from the first rear cover 20 and the side of the second frame 30 away from the second rear cover 40. The prompting member 60 located on the side of the first frame 10 away from the first rear cover 20 is configured to connect to the fan 100 in the first accommodating cavity, and the prompting member 60 is configured to prompt when the fan 100 in the first accommodating cavity fails. The prompting member 60 located on the side of the second frame 30 away from the second rear cover 40 is configured to connect to the fan 100 in the second accommodating cavity 301, and the prompting member 60 is configured to prompt when the fan 100 in the second accommodating cavity 301 fails.

Since the prompting member 60 is mounted on the side of the first frame 10 away from the first rear cover 20, after the fan 100 is placed in the first accommodating cavity of the first frame 10, the prompting member 60 may be electrically connected to the fan 100, so that when the fan 100 fails, the prompting member 60 may give a prompt, so that the operator may know whether the fan 100 fails or not. Similarly, since the prompting member 60 is mounted on the side of the second frame 30 away from the second rear cover 40, after the fan 100 is placed in the second accommodating cavity 301 of the second frame 30, the prompting member 60 may be electrically connected to the fan 100, so that when the fan 100 fails, the prompting member 60 may give a prompt, so that the operator may know whether the fan 100 fails or not. That is, the prompting member 60 is provided, so that the operator may know the current operation of the fan 100, that is, know whether the fan 100 fails or not.

It should be noted that the number of the prompting members 60 may be set according to actual needs. For example, the number of the prompting members 60 is 1, and for another example, the number of the prompting members 60 is 2. The specific number of the prompting members 60 is not limited in the embodiment of the present application.

In some embodiments of the present application, the prompting member 60 may include any one of a prompting light and a buzzer.

When the prompting member 60 includes a prompting light, if the fan 100 in the first frame 10 or the fan 100 in the second frame 30 fails, the prompting light will flash. In actual application, after the fan bracket is applied to the server cabinet, the operator may determine which fan 100 fails according to the flashing of the prompting light after opening the server cabinet.

When the prompting member 60 includes the buzzer, the buzzer will sound if the fan 100 in the first frame 10 or a fan 100 in the second frame 30 fails. In actual application, after the fan bracket is applied to the server cabinet, the operator may hear the sound of the buzzer and determine which fan 100 in the server cabinet fails.

It should be noted that the prompting light may be an LED light, and of course, may also be other types of luminous lights. The specific type of the prompting light is not limited in the embodiments of the present application.

In some embodiments of the present application, the side of the first frame 10 away from the first rear cover 20 is provided with a prompting member bracket 70, the prompting member bracket 70 is detachably connected to the first frame 10, and the prompting member 60 is mounted on the prompting member bracket 70. The side of the second frame 30 away from the second rear cover 40 is provided with the prompting member bracket 70, the prompting member bracket 70 is detachably connected to the second frame 30, and the prompting member 60 is mounted on the prompting member bracket 70.

Since the side of the first frame 10 away from the first rear cover 20 is provided with the prompting member bracket 70, the prompting member 60 may be directly mounted on the prompting member bracket 70, so that the prompting member 60 may be easily mounted on the side of the first frame 10 away from the first rear cover 20. Since the prompting member bracket 70 is detachably connected to the first frame 10, the prompting member bracket 70 may be removed from the first frame 10, and the position of the prompting member bracket 70 on the first frame 10 may be adjusted. When the prompting member 60 fails, the prompting member bracket 70 may be separated from the first frame 10, and then the prompting member 60 may be removed from the prompting member bracket 70 to replace the prompting member 60. That is, the prompting member bracket 70 is provided, so that it is convenient to provide the prompting member 60 on the first frame 10 and to replace the prompting member 60.

Similarly, since the side of the second frame 30 away from the second rear cover 40 is provided with the prompting member bracket 70, the prompting member 60 may be directly mounted on the prompting member bracket 70, so as to facilitate mounting of the prompting member 60 on the side of the second frame 30 away from the second rear cover 40. Since the prompting member bracket 70 is detachably connected to the second frame 30, the prompting member bracket 70 may be removed from the second frame 30, and the position of the prompting member bracket 70 on the second frame 30 may be adjusted. When the prompting member 60 fails, the prompting member bracket 70 may be separated from the second frame 30, and then the prompting member 60 may be removed from the prompting member bracket 70 to replace the prompting member 60. That is, the prompting member bracket 70 is provided, so that it is convenient to provide the prompting member 60 on the second frame 30 and to replace the prompting member 60.

In some embodiments of the present application, the prompting member bracket 70 may include a mounting plate 71 and a fixing plate 72. The mounting plate 71 has a first surface and a second surface opposite to each other, the fixing plate 72 is connected to the first surface of the mounting plate 71, the mounting plate 71 is provided with a mounting hole 711, the first surface of the mounting plate 71 is provided with a supporting member 712, and the supporting member 712 is located around the mounting hole 711, the prompting member 60 is penetrated in the mounting hole 711, the prompting member 60 abuts against the supporting member 712, and the supporting member 712 supports the prompting member 60. The fixing plate 72 is provided with a third clamping hole 721, the first frame 10 has a first clamping platform 14 on the side away from the first rear cover 20, and the second frame 30 has a second clamping platform 34 on the side away from the second rear cover 40. The first clamping platform 14 is clamped into the third clamping hole 721 on one prompting member bracket 70, and the second clamping platform 34 is clamped into the third clamping hole 721 on the other prompting member bracket 70.

Since the fixing plate 72 is connected to the first surface of the mounting plate 71, the mounting plate 71 is provided with a mounting hole 711, the first surface of the mounting plate 71 is provided with a supporting member 712, and the supporting member 712 is located around the mounting hole 711, when the prompting member 60 is mounted, the prompting member 60 may be penetrated in the mounting hole 711, and the prompting member 60 may abut against the supporting member 712, so that the supporting member 712 supports the prompting member 60 to prevent the prompting member 60 from falling out of the mounting hole 711. Since the fixing plate 72 is provided with a third clamping hole 721, and the first frame 10 has a first clamping platform 14 on the side away from the first rear cover 20, the third clamping hole 721 may be clamped onto the first clamping platform 14, so that the prompting member bracket 70 is clamped onto the first frame 10, and the first frame 10 and the prompting member bracket 70 are detachably connected. Similarly, since the fixing plate 72 is provided with a third clamping hole 721, and the second frame 30 has a second clamping platform 34 on the side away from the second rear cover 40, the third clamping hole 721 may be clamped onto the second clamping platform 34, so that the prompting member bracket 70 is clamped onto the second frame 30, and the second frame 30 and the prompting member bracket 70 are detachably connected.

It should be noted that the number of first clamping platforms 14 may be multiple, and the multiple first clamping platforms 14 are distributed at different positions of the first frame 10, so that the prompt member bracket 70 may be clamped into different first clamping platforms 14, and then the position of the prompt member bracket 70 on the first frame 10 may be adjusted.

In some embodiments of the present application, the first clamping platform 14 may be bent shape, so that when the third clamping hole 721 is clamped onto the first clamping platform 14, the first clamping platform 14 may first pass through the first clamping platform 14, and then move the third clamping hole 721 relative to the first clamping platform 14 along the bent shape of the first clamping platform 14, and the bent portion of the first clamping platform 14 blocks the third clamping hole 721, thereby preventing the fixing plate 72 from falling off the first clamping platform 14 and preventing the connector bracket 50 from being separated from the first frame 10. The shape of the second clamping platform 34 may be the same as that of the first clamping platform 14, so that the way in which the third clamping hole 721 is clamped onto the second clamping platform 34 can refer to the way in which the third clamping hole 721 is clamped onto the first clamping platform 14, which is not described herein.

In some embodiments of the present application, the first frame 10 has a first clamping channel 15 on one side away from the first rear cover 20, the second frame 30 has a second clamping channel 35 on one side away from the second rear cover 40, the fixing plate 72 is provided with a limiting platform 722, and the limiting platform 722 is spaced apart from the third clamping hole 721. A limiting platform 722 on a prompting member bracket 70 is embedded in the first clamping channel 15, and a limiting platform 722 on another prompting member bracket 70 is embedded in the second clamping channel 35.

Since the first frame 10 has a first clamping channel 15 on the side away from the first rear cover 20, the fixing plate 72 is provided with the limiting platform 722 on, and the limiting platform 722 is spaced apart from the third clamping hole 721, when the third clamping hole 721 on the fixing plate 72 is clamped into the first clamping platform 14, the limiting platform 722 may be embedded in the first clamping channel 15, so that the first clamping channel 15 limits the limiting platform 722, the limiting platform 722 is fixed, the fixing plate 72 is fixed, and the prompting member bracket 70 is prevented from shaking on the first frame 10. Similarly, since the second frame 30 has a second clamping channel 35 on the side away from the second rear cover 40, the fixing plate 72 is provided with a limiting platform 722, and the limiting platform 722 is spaced apart from the third clamping hole 721, when the third clamping hole 721 on the fixing plate 72 is clamped into the second clamping platform 34, the limiting platform 722 may be embedded in the second clamping channel 35, so that the second clamping channel 35 limits the limiting platform 722, the limiting platform 722 is fixed, the fixing plate 72 is fixed, and the prompting member bracket 70 is prevented from shaking on the second frame 30.

It should be noted that the first clamping slots 11 correspond to the first clamping platforms 14 one by one, that is, the number of the first clamping slots 11 is equal to the number of the first clamping platforms 14. In addition, the second clamping slots 21 correspond to the second clamping platforms 34 one by one, that is, the number of the second clamping slots 21 is equal to the number of the second clamping platforms 34.

In some embodiments of the present application, a first positioning pin 001 is provided on the cavity wall of the first accommodating cavity and the cavity wall of the second accommodating cavity 301, and a second positioning pin 002 is provided on the first rear cover 20 and the second rear cover 40, positions of the first positioning pin 001 and the second positioning pin 002 are opposite to each other, and the first positioning pin 001 and the second positioning pin 002 are configured to position the fan 100.

Since the cavity wall of the first accommodating cavity is provided with the first positioning pin 001, the first rear cover 20 is provided with the second positioning pin 002, and positions of the first positioning pin 001 and the second positioning pin 002 are opposite to each other, when the fan 100 is placed in the first accommodating cavity, the positioning hole on the fan 100 may be sleeved on the first positioning pin 001 in the first accommodating cavity, and after the first rear cover 20 is connected to the first frame 10, the second pin is penetrated the positioning hole of the fan 100, which is equivalent to positioning the fan 100 on both sides of the fan 100, so that the fan 100 is not easy to move in the first accommodating cavity. That is, the cavity wall of the first accommodating cavity is provided with the first positioning pin 001 and the first rear cover 20 is provided with the second positioning pin 002, the fan 100 in the first accommodating cavity may be positioned and not easy to shake.

Similarly, since the cavity wall of the second accommodating cavity 301 is provided with the first positioning pin 001, the second rear cover 40 is provided with the second positioning pin 002, and the positions of the first positioning pin 001 and the second positioning pin 002 are opposite to each other, when the fan 100 is placed in the second accommodating cavity 301, the positioning hole on the fan 100 may be sleeved on the first positioning pin 001 in the second accommodating cavity 301, and after the second rear cover 40 is connected to the second frame 30, the second pin is penetrated in the positioning hole of the fan 100, which is equivalent to positioning the fan 100 on both sides of the fan 100, so that the fan 100 is not easy to move in the second accommodating cavity 301. That is, the cavity wall of the second accommodating cavity 301 is provided with the first positioning pin 001 and the second rear cover 40 is provided with the second positioning pin 002, so that the fan 100 in the second accommodating cavity 301 may be positioned and not easy to shake.

It should be noted that the number of the first positioning pins 001 may be set according to actual needs, and the distribution of the first positioning pins 001 is set according to the distribution of the positioning holes in the fan 100. The number of the second positioning pins 002 is the same as the number of the first positioning pins 001.

In some embodiments of the present application, the first rear cover 20 is provided with a third hook 22, the third hook 22 extends in the direction from the first rear cover 20 to the first frame 10, the first frame 10 has a third clamping slot, and the third hook 22 is embedded in the third clamping slot. The second rear cover 40 is provided with a fourth hook 42, the fourth hook 42 extends in the direction from the second rear cover 40 to the second frame 30, the second frame 30 has a fourth clamping slot, and the fourth hook 42 is embedded in the fourth clamping slot.

Since the first rear cover 20 is provided with a third hook 22, the third hook 22 extends in the direction from the first rear cover 20 to the first frame 10, and the first frame 10 has a third clamping slot, the third hook 22 may be clamped into the third clamping slot, so that the first rear cover 20 is connected to the first frame 10. When the first rear cover 20 needs to be separated from the first frame 10, the third hook 22 may be detached from the third clamping slot. That is, the first rear cover 20 is provided with the third hook 22, the first frame 10 is provided with the third clamping slot, and the third hook 22 is clamped into the third clamping slot, so that the first rear cover 20 and the first frame 10 may be detachably connected. In addition, the third hook 22 and the third clamping slot are provided, so that the use of other tools may be avoided when the first rear cover 20 is connected to the first frame 10, and the operator may directly connect the first rear cover 20 to the first frame 10 by hand, that is, the effect of connecting the first rear cover 20 to the first frame 10 without tools is achieved.

Similarly, since the second rear cover 40 is provided with a fourth hook 42, the fourth hook 42 extends in the direction from the second rear cover 40 to the second frame 30, and the second frame 30 has a fourth clamping slot, the fourth hook 42 may be clamped into the fourth clamping slot, so that the second rear cover 40 is connected to the second frame 30. When the second rear cover 40 needs to be separated from the second frame 30, the fourth hook 42 may be detached from the fourth clamping slot. That is, the second rear cover 40 is provided with the fourth hook 42, the second frame 30 is provided with the fourth clamping slot, and the fourth hook 42 is clamped into the fourth clamping slot, so that the second rear cover 40 and the second frame 30 may be detachably connected. In addition, the fourth hook 42 and the fourth clamping slot are provided, so that the use of other tools may be avoided when the second rear cover 40 is connected to the second frame 30, and the operator may directly connect the second rear cover 40 to the second frame 30 by hand, that is, the effect of connecting the second rear cover 40 to the second frame 30 without tools is achieved.

It should be noted that the number of the third hooks 22 may be set according to actual needs, and when the number of the third hooks 22 is multiple, the multiple third hooks 22 are spaced apart along the circumferential direction of the first rear cover 20. For example, the number of the third hooks 22 is 8, and the 8 third hooks 22 are spaced apart along the circumferential direction of the first rear cover 20. For another example, the number of the second hooks 41 is 12, and the 12 third hooks 22 are spaced apart along the circumferential direction of the first rear cover 20. The specific number of the third hooks 22 is not limited in the embodiment of the present application. In addition, the number of the third clamping slots is equal to the number of the second hooks 41. And the distribution of the third clamping slots on the first frame 10 is the same as the distribution of the third hooks 22 on the first rear cover 20.

In some embodiments of the present application, the number of the fourth hooks 42 may be set according to actual needs, and when the number of the fourth hooks 42 is multiple, the multiple fourth hooks 42 are spaced apart along the circumferential direction of the second rear cover 40. For example, the number of the fourth hooks 42 is 8, and the 8 fourth hooks 42 are spaced apart along the circumferential direction of the second rear cover 40. For another example, the number of the second hooks 41 is 12, and the 12 fourth hooks 42 are spaced apart along the circumferential direction of the second rear cover 40. The specific number of the fourth hooks 42 is not limited in the embodiments of the present application. In addition, the number of the fourth clamping slots is equal to the number of the second hooks 41. And the distribution of the fourth clamping slots on the second frame 30 is the same as the distribution of the fourth hooks 42 on the second rear cover 40.

In some embodiments of the present application, the first frame 10 may be provided with a third hook 22, the first rear cover 20 may be provided with a third clamping slot, and the third hook 22 may be clamped into the third clamping slot, so that the first rear cover 20 is detachably connected to the first frame 10. In addition, the second frame 30 may be provided with a fourth hook 42, the second rear cover 40 may be provided with a fourth clamping slot, and the fourth hook 42 may be clamped into the fourth clamping slot, so that the second rear cover 40 is detachably connected to the second frame 30.

Of course, the first rear cover 20 and the first frame 10 may be detachably connected in other ways, for example, the first rear cover 20 is provided with a through hole, the first frame 10 is provided with a threaded hole, and the first rear cover 20 and the first frame 10 are detachably connected by passing bolts through the through hole in the first rear cover 20 and the threaded hole in the first frame 10. The specific connection ways by which the second rear cover 40 and the second frame 30 are detachably connected is not limited in the embodiment of the present application.

In some embodiments of the present application, the second rear cover 40 and the second frame 30 may be detachably connected in other ways, for example, the second rear cover 40 is provided with a through hole, the second frame 30 is provided with a threaded hole, and the second rear cover 40 and the second frame 30 are detachably connected by passing bolts through the through hole in the second rear cover 40 and the threaded holes in the second frame 30. The specific connection ways by which the second rear cover 40 and the second frame 30 are detachably connected is not limited in the embodiments of the present application.

In some embodiments of the present application, the first frame 10 has a handheld portion 101 for carrying the first frame 10.

Since the first frame 10 has the handheld portion 101, when the first frame 10, i.e., the fan bracket, needs to be carried, the operator may directly put his hand into the handheld portion 101 to carry the first frame 10, thereby carrying the fan bracket. That is, the first frame 10 has the handheld portion 101 to facilitate the operator to carry the fan bracket.

In the embodiments of the present application, since the first frame 10 has a first accommodating cavity, the first frame 10 is detachably connected to the first rear cover 20, and the first rear cover 20 blocks the cavity opening of the first accommodating cavity, when it is necessary to mount the fan 100, the first rear cover 20 may be separated from the first frame 10, then the fan 100 is mounted in the first accommodating cavity, and then the first rear cover 20 is connected to the first frame 10. Since the second frame 30 has a second accommodating cavity 301, the second frame 30 is detachably connected to the second rear cover 40, and the second rear cover 40 blocks the cavity opening of the second accommodating cavity 301, when it is necessary to mount the fan 100, the second rear cover 40 may be separated from the second frame 30, then the fan 100 is mounted in the second accommodating cavity 301, and then the second rear cover 40 is connected to the second frame 30. Since the first frame 10 and the second frame 30 are stacked and detachably connected, and the first rear cover 20 and the second rear cover 40 are detachably connected, the first frame 10 and the second frame 30 may be separated and the first rear cover 20 and the second rear cover 40 may be separated according to actual needs, so that the first frame 10 and the second frame 30 may be used separately. Or the first frame 10 and the second frame 30 may be connected, and the first rear cover 20 and the second rear cover 40 may be connected, so that the first frame 10 and the second frame 30 may be used at the same time. That is, in the embodiments of the present application, the first frame 10 and the second frame 30 are stacked and detachably connected, and the first rear cover 20 and the second rear cover 40 are detachably connected, so that in actual application the first frame 10 and the second frame 30 may be separated, the first rear cover 20 and the second rear cover 40 may be separated, or the first frame 10 and the second frame 30 may be connected, and the first rear cover 20 and the second rear cover 40 may be connected according to actual needs. That is, the fan 100 is placed in the first frame 10, and the fan 100 is placed in the second frame 30, so that the first frame 10 and the second frame 30 may be separated or connected according to actual needs, different frames may be provided for different server cabinets, different numbers of fans 100 may dissipate heat for servers in the server cabinets, the application of the fan bracket is wider in range and more flexible.

Figure 16:
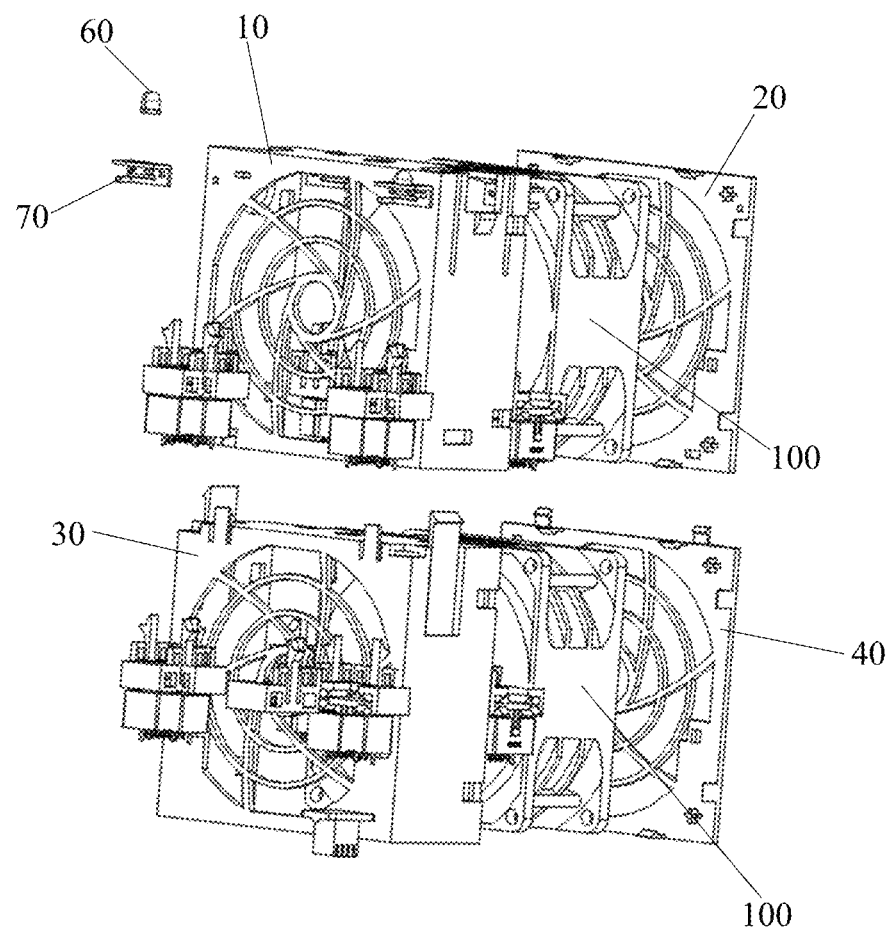
FIG. 16 is an exploded view of a heat dissipation assembly according to some embodiments of the present application.

Some embodiments of the present application provide a heat dissipation assembly. As shown in FIG. 16, the heat dissipation assembly includes a fan 100 and a fan bracket in any one of the above embodiments. The fan 100 is provided in the first accommodating cavity and the second accommodating cavity 301.

In the embodiment of the present application, since the first frame 10 has a first accommodating cavity, the first frame 10 is detachably connected to the first rear cover 20, and the first rear cover 20 blocks the cavity opening of the first accommodating cavity, when it is necessary to mount the fan 100, the first rear cover 20 may be separated from the first frame 10, then the fan 100 is mounted in the first accommodating cavity, and then the first rear cover 20 is connected to the first frame 10. Since the second frame 30 has a second accommodating cavity 301, the second frame 30 is detachably connected to the second rear cover 40, and the second rear cover 40 blocks the cavity opening of the second accommodating cavity 301, when it is necessary to mount the fan 100, the second rear cover 40 may be separated from the second frame 30, and then the fan 100 is mounted in the second accommodating cavity 301, and then the second rear cover 40 is connected to the second frame 30. Since the first frame 10 and the second frame 30 are stacked and detachably connected, and the first rear cover 20 and the second rear cover 40 are detachably connected, the first frame 10 and the second frame 30 may be separated and the first rear cover 20 and the second rear cover 40 may be separated according to actual needs, so that the first frame 10 and the second frame 30 may be used separately. Or the first frame 10 and the second frame 30 may be connected, and the first rear cover 20 and the second rear cover 40 may be connected, so that the first frame 10 and the second frame 30 may be used at the same time. That is, in the embodiments of the present application, the first frame 10 and the second frame 30 are stacked and detachably connected, and the first rear cover 20 and the second rear cover 40 are detachably connected, so that in actual application, the first frame 10 and the second frame 30 may be separated, the first rear cover 20 and the second rear cover 40 may be separated, or the first frame 10 and the second frame 30 may be connected, and the first rear cover 20 and the second rear cover 40 may be connected according to actual needs. That is, the fan 100 is placed in the first frame 10, and the fan 100 is placed in the second frame 30, so that the first frame 10 and the second frame 30 may be separated or connected according to actual needs, different frames may be provided for different server cabinets, different numbers of fans 100 may dissipate heat for servers in the server cabinets, and the application of the fan bracket is wider in range and more flexible.

In some embodiments of the present application, the heat dissipation assembly may further include a control circuit board and a connector 200. The fan bracket includes a connector bracket 50, the connector 200 is mounted on the connector bracket 50, the connector 200 is electrically connected to the fan 100, the connector 200 is electrically connected to the control circuit board, and the control circuit board is configured to control the operation of the fan 100.

Since the connector 200 is electrically connected to the control circuit board, and the connector 200 is electrically connected to the fan 100, the control circuit board may send a control instruction to the fan 100 through the connector 200, thereby controlling the operation of the fan 100.

It should be noted that the control circuit board may be a printed circuit board (PCB), and of course, the control circuit board may also be a flexible printed circuit (FPC). The specific type of the control circuit board is not limited in the embodiments of the present application.

In some embodiments of the present application, the connector 200 may be electrically connected to the fan 100 by a wire or other conductive member, and the connector 200 may be plugged into a control circuit and electrically connected to the control circuit board.

In some embodiments of the present application, the fan bracket may include a prompting member 60 electrically connected to the connector 200, and the control circuit board is further configured to control the prompting member 60 to prompt when the fan 100 fails.

Since the prompting member 60 is electrically connected to the connector 200, and the connector 200 is electrically connected to the control circuit board, the control circuit board may control the prompting member 60 to prompt by sending a control instruction to the prompting member 60 through the connector 200. In addition, after the fan 100 is electrically connected to the control circuit board through the connector 200, and the prompting member 60 is electrically connected to the control circuit board through the connector 200, if the operation of the fan 100 fails, the control circuit board may control the prompting member 60 to prompt.

Figure 17:
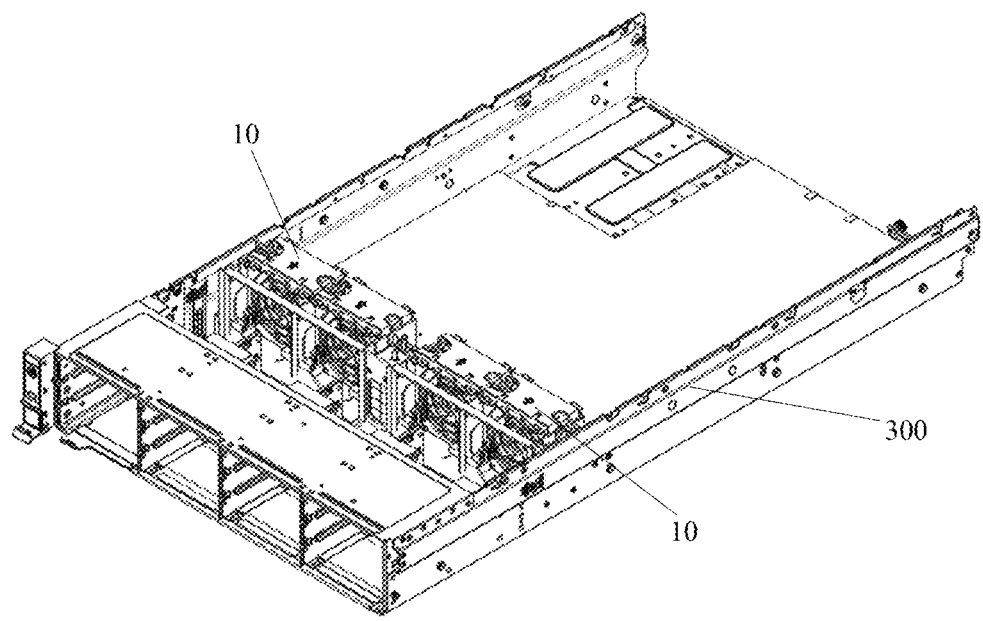
FIG. 17 is a schematic diagram of a server cabinet according to some embodiments of the present application.
Figure 18:
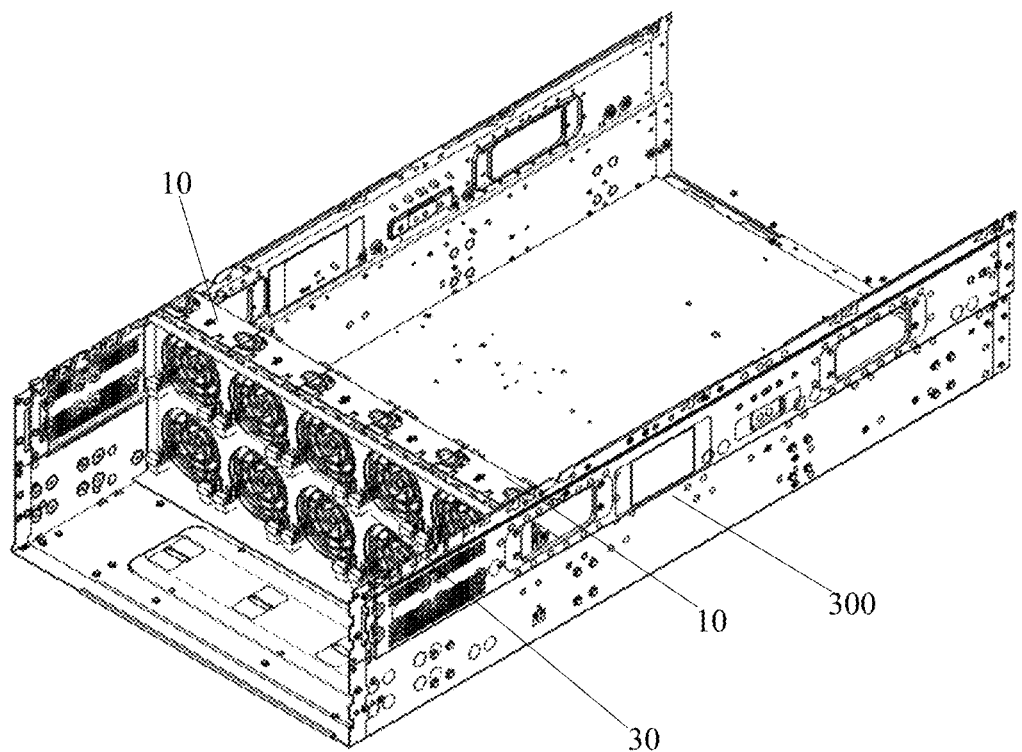
FIG. 18 is a schematic diagram of another server cabinet according to some embodiments of the present application.

Some embodiments of the present application provide a server cabinet, as shown in FIG. 17 and FIG. 18, the server cabinet includes a cabinet body 300 and a heat dissipation assembly in any one of the above embodiments. The heat dissipation assembly is located in the cabinet body 300.

In some embodiments of the present application, when the heat dissipation assembly is applied in the cabinet body 300 of the server cabinet, the control circuit board in the heat dissipation assembly may be a circuit board in the cabinet 300, that is, the circuit board in the cabinet 300 is directly applied, or the control circuit board may be specially provided.

It should be noted that various embodiments in the description are described in a progressive manner, each of the embodiments focuses on the differences with other embodiments. The same or similar parts of the various embodiments can be referred to each other.

Although the preferred embodiments of the present application have been described, those skilled in the art can make additional changes and modifications to these embodiments once they know the basic inventive concepts. Therefore, the appended claims are intended to be interpreted as including the preferred embodiments and all the changes and modifications that fall within the scope of the embodiments of the present application.

Finally, it should also be noted that in this article, relational terms such as first and second are used only to distinguish one entity from another without necessarily requiring or implying any such actual relationship or order between these entities or operations. Moreover, the term 'including', 'containing' or any other variant is intended to cover non-exclusive inclusion, so that the objects or terminal devices that include a series of elements includes not only those elements, but also other elements that are not clearly listed, or also includes the inherent elements of such the objects or terminal devices. Without more restrictions, the limited elements by the sentence 'includes one . . . ' do not exclude that there are other same elements in the objects or terminal devices equipment that include the elements.

Technical solutions according to the present application has been introduced in detail above, and principle and embodiments of the present application have been set forth with specific examples in this document. Meanwhile, changes can be made to the specific embodiments and application scope by ordinary skilled in the art according to the principle and embodiments of the present disclosure. To sum up, contents of this specification should not be construed as limitation to the present disclosure.

The invention claimed is:

1. A fan bracket, comprising: a first frame, a first rear cover, a second frame and a second rear cover;
the first frame has a first accommodating cavity for accommodating a fan, the first frame is detachably connected to the first rear cover, and the first rear cover blocks a cavity opening of the first accommodating cavity;
the second frame has a second accommodating cavity for accommodating the fan, the second frame is detachably connected to the second rear cover, and the second rear cover blocks a cavity opening of the second accommodating cavity; and
the first frame and the second frame are stacked and detachably connected, and the first rear cover is detachably connected to the second rear cover;
wherein a side of the first frame away from the first rear cover is provided with a connector bracket, a side of the second frame away from the second rear cover is provided with the connector bracket, the side of the first frame away from the first rear cover is fixed with a plurality of first clamping bosses, and the side of the second frame away from the second rear cover is fixed with a plurality of second clamping bosses;
the connector bracket comprises a supporting shell having a mounting surface, a plurality of first clamping plates are provided at intervals in a first direction on the mounting surface, the first clamping plate is provided with a first clamping hole, a plurality of second clamping plates are provided at intervals in a second direction on the mounting surface, the second clamping plate is provided with a second clamping hole, and an angle is between the first direction and the second direction;
the first clamping boss is embedded in the first clamping hole or the second clamping hole on one of the connector brackets, and the second clamping boss is embedded in the first clamping hole or the second clamping hole on the other of the connector brackets; and
the supporting shell has an accommodating space for accommodating and supporting the connector.

2. The fan bracket according to claim 1, wherein the second frame is provided with a first hook, the first frame is provided with a first clamping slot, and the first hook is clamped into the first clamping slot.

3. The fan bracket according to claim 2, wherein the first hook extends in a direction from the second frame to the first frame, and the first hook protrudes from the second frame.

4. The fan bracket according to claim 1, wherein the second rear cover is provided with a second hook, the first rear cover is provided with a second clamping slot, and the second hook is clamped into the second clamping slot.

5. The fan bracket according to claim 1, wherein the first frame is detachably connected to the connector bracket;
the second frame is detachably connected to the connector bracket; and
the connector bracket is configured to support a connector for being electrically connected to the fan.

6. The fan bracket according to claim 1, wherein the supporting shell comprises a first supporting plate, a second supporting plate, a first connecting plate, a second connecting plate and a third connecting plate;
the first supporting plate and the second supporting plate are stacked with a gap therebetween, the gap forms the accommodating space, the first connecting plate, the second connecting plate and the third connecting plate are located between the first supporting plate and the second supporting plate, the first connecting plate is connected to the first supporting plate and the second supporting plate respectively, the second connecting plate is connected to the first supporting plate and the second supporting plate respectively, the third connecting plate is connected to the first supporting plate and the second supporting plate respectively, and the first connecting plate, the second connecting plate and the third connecting plate are connected in sequence;
a plurality of first clamping plates are provided at intervals in a first direction on a surface of the first supporting plate away from the second supporting plate, and a plurality of second clamping plates are provided at intervals in a second direction on the surface of the first supporting plate away from the second supporting plate; and
the second supporting plate is provided with a mounting slot for mounting the connector.

7. The fan bracket according to claim 6, wherein a surface of the second supporting plate toward the first supporting plate is provided with a limiting hook, the limiting hook is located on both sides of the mounting slot, and the limiting hook is configured to abut against the connector and limit the connector when the connector is mounted in the mounting slot; and
a surface of the first supporting plate toward the second supporting plate is provided with an abutting plate with a distance between the abutting plate and the second supporting plate, and the abutting plate is configured to abut against the connector when the connector is mounted in the mounting slot.

8. The fan bracket according to claim 6, wherein an extension direction of the first connecting plate is the same as the first direction, an extension direction of the second connecting plate is the same as the second direction, the side of the first frame away from the first rear cover is provided with a first positioning hole, and the side of the second frame away from the second rear cover is provided with a second positioning hole;
the first supporting plate is provided with a first avoidance slot and a second avoidance slot, the first connecting plate is provided with a first positioning hook, the first positioning hook extends in a direction from the second supporting plate to the first supporting plate, the first positioning hook is penetrated in the first avoidance slot and protrudes from the first supporting plate, the second connecting plate is provided with a second positioning hook, the second positioning hook extends in a direction from the second supporting plate to the first supporting plate, the second positioning hook is penetrated in the second avoidance slot and protrudes from the first supporting plate; and the first positioning hole is clamped into the first positioning hook or the second positioning hook on one of the connector brackets, and the second positioning hole is clamped into the first positioning hook or the second positioning hook on the other of the connector brackets.

9. The fan bracket according to claim 1, wherein the side of the first frame away from the first rear cover and the side of the second frame away from the second rear cover are mounted with a prompting member;

the prompting member located on the side of the first frame away from the first rear cover is configured to be connected to the fan in the first accommodating cavity and prompt when the fan in the first accommodating cavity fails; and the prompting member located on the side of the second frame away from the second rear cover is configured to be connected to the fan in the second accommodating cavity and prompt when the fan in the second accommodating cavity fails.

10. The fan bracket according to claim 9, wherein the side of the first frame away from the first rear cover is provided with a prompting member bracket, the prompting member bracket is detachably connected to the first frame, and the prompting member is mounted on the prompting member bracket; and the side of the second frame away from the second rear cover is provided with the prompting member bracket, the prompting member bracket is detachably connected to the second frame, and the prompting member is mounted on the prompting member bracket.

11. The fan bracket according to claim 10, wherein the prompting member comprises any one of a prompting light and a buzzer.

12. The fan bracket according to claim 10, wherein the prompting member bracket comprises a mounting plate and a fixing plate;

the mounting plate has a first surface and a second surface opposite to each other, the fixing plate is connected to the first surface of the mounting plate, the mounting plate is provided with a mounting hole, the first surface of the mounting plate is provided with a supporting member, the supporting member is located around the mounting hole, the prompting member is penetrated in the mounting hole, the prompting member abuts against the supporting member, and the supporting member supports the prompting member;

the fixing plate is provided with a third clamping hole, the side of the first frame away from the first rear cover is provided with a first clamping platform, the side of the second frame away from the second rear cover is provided with a second clamping platform; and the first clamping platform is clamped into the third clamping hole on one of the prompting member brackets, and the second clamping platform is clamped into the third clamping hole on the other of the prompting member brackets.

13. The fan bracket according to claim 12, wherein the side of the first frame away from the first rear cover is provided with a first clamping channel, the side of the second frame away from the second rear cover is provided with a second clamping channel, the fixing plate is provided with a limiting platform, and the limiting platform is spaced apart from the third clamping hole; and the limiting platform on one of the prompting member brackets is embedded in the first clamping channel, and the limiting platform on the other of the prompting member brackets is embedded in the second clamping channel.

14. The fan bracket according to claim 1, wherein a cavity wall of the first accommodating cavity and a cavity wall of the second accommodating cavity are provided with a first positioning pin, the first rear cover and the second rear cover are provided with a second positioning pin, the first positioning pin is opposite to the second positioning pin, and the first positioning pin and the second positioning pin are configured to position the fan.

15. The fan bracket according to claim 1, wherein the first rear cover is provided with a third hook, the third hook extends in a direction from the first rear cover to the first frame, the first frame is provided with a third clamping slot, and the third hook is embedded in the third clamping slot; and the second rear cover is provided with a fourth hook, the fourth hook extends in a direction from the second rear cover to the second frame, the second frame is provided with a fourth clamping slot, and the fourth hook is embedded in the fourth clamping slot.

16. The fan bracket according to claim 1, wherein the first frame is provided with a handheld portion for carrying the first frame.

17. A heat dissipation assembly, comprising a fan and the fan bracket according to claim 1;

wherein the first accommodating cavity and the second accommodating cavity are provided with the fan.

18. The heat dissipation assembly according to claim 17, wherein the heat dissipation assembly further comprises a control circuit board and a connector; and the fan bracket comprises a connector bracket, the connector is mounted on the connector bracket, the connector is electrically connected to the fan, the connector is electrically connected to the control circuit board, and the control circuit board is configured to control the fan to operate.

19. The heat dissipation assembly according to claim 18, wherein the fan bracket comprises a prompting member electrically connected to the connector, and the control circuit board is further configured to control the prompting member to prompt when the fan fails.

20. A server cabinet, comprising a cabinet body and the heat dissipation assembly according to claim 17;

wherein the heat dissipation assembly is located in the cabinet body.

* * * * *